US009711238B2

(12) United States Patent
Murakami et al.

(10) Patent No.: US 9,711,238 B2
(45) Date of Patent: Jul. 18, 2017

(54) SHIFT REGISTER, SCAN SIGNAL LINE DRIVER CIRCUIT, DISPLAY PANEL AND DISPLAY DEVICE

(71) Applicant: Sharp Kabushiki Kaisha, Osaka-shi, Osaka (JP)

(72) Inventors: Yuhichiroh Murakami, Osaka (JP); Yasushi Sasaki, Osaka (JP); Takahiro Yamaguchi, Osaka (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 394 days.

(21) Appl. No.: 14/359,919

(22) PCT Filed: Dec. 10, 2012

(86) PCT No.: PCT/JP2012/081958
§ 371 (c)(1),
(2) Date: May 22, 2014

(87) PCT Pub. No.: WO2013/089071
PCT Pub. Date: Jun. 20, 2013

(65) Prior Publication Data
US 2014/0313174 A1 Oct. 23, 2014

(30) Foreign Application Priority Data
Dec. 16, 2011 (JP) .................. 2011-276445

(51) Int. Cl.
*G11C 19/28* (2006.01)
*G09G 3/36* (2006.01)

(52) U.S. Cl.
CPC ........ *G11C 19/28* (2013.01); *G09G 3/3674* (2013.01); *G09G 3/3677* (2013.01)

(58) Field of Classification Search
CPC ........ G09G 2310/0286; G09G 3/3674; G09G 3/3677; G11C 19/28
See application file for complete search history.

(56) References Cited

U.S. PATENT DOCUMENTS

| | | | |
|---|---|---|---|
| 6,580,411 B1 * | 6/2003 | Kubota | ............... G09G 3/3677 345/100 |
| 2012/0092323 A1 | 4/2012 | Murakami et al. | |
| 2014/0098016 A1 | 4/2014 | Furuta et al. | |

FOREIGN PATENT DOCUMENTS

| | | |
|---|---|---|
| JP | 2005-228459 A | 8/2005 |
| JP | 2005228459 A * | 8/2005 |

(Continued)

OTHER PUBLICATIONS

Official Communication issued in International Patent Application No. PCT/JP2012/081958, mailed on Mar. 12, 2013.

*Primary Examiner* — Latanya Bibbins
(74) *Attorney, Agent, or Firm* — Keating & Bennett, LLP

(57) ABSTRACT

The purpose of the present invention is to reduce a circuit size of a shift register. A shift register of the present invention includes stages each including a holding circuit (11) and a clock output circuit (12). The clock output circuit (12) includes an output terminal (O) that outputs a signal having a high electric potential or a low electric potential, depending on at least one of outputs (Q) from the holding circuit (11) and on a second clock signal. The holding circuit (11) carries out a reset operation in accordance with a first clock signal supplied to a transistor (N1).

15 Claims, 35 Drawing Sheets

(56) References Cited

FOREIGN PATENT DOCUMENTS

| WO | 2010/146756 A1 | 12/2010 |
| WO | 2013/002190 A1 | 1/2013 |
| WO | 2013/002228 A1 | 1/2013 |
| WO | 2013/002229 A1 | 1/2013 |

* cited by examiner

US 9,711,238 B2

SHIFT REGISTER, SCAN SIGNAL LINE DRIVER CIRCUIT, DISPLAY PANEL AND DISPLAY DEVICE

TECHNICAL FIELD

The present invention relates to a shift register for use in a display device.

BACKGROUND ART

In recent years, for the purpose of narrowing edges of a liquid crystal display device, there have been demands for a reduction in size of a display drive circuit that drives a liquid crystal panel. Since a size of a display drive circuit is largely affected by the number of transistors by which the display drive circuit is configured, it is important to reduce the number of transistors.

An example of a conventional display drive circuit is a shift register for use in a scan signal line drive circuit (gate driver) (e.g. Patent Literature 1). FIG. 33 is a block diagram schematically illustrating a configuration of a conventional shift register. FIG. 34 is a circuit diagram illustrating one of stages (hereinafter referred to as "SR unit circuit(s)") by which the shift register is configured.

As illustrated FIG. 34, the SR unit circuit includes an RS flip-flop 110 and a clock outputting section 120. The RS flip-flop (hereinafter referred to as "flip-flop") 110 includes (i) a P-channel transistor P100 and an N-channel transistor N101 by which a CMOS circuit is configured, (ii) a P-channel transistor P101 and an N-channel transistor N102 by which a CMOS circuit is configured, (iii) an N-channel transistor N100, (iv) an S terminal (set terminal), (v) an R terminal (reset terminal), (vi) an INITB terminal (initial terminal), (vii) a Q terminal, and (viii) a QB terminal. A gate terminal of the transistor P100, a gate terminal of the transistor N101, a drain terminal of the transistor N100, a drain terminal of the transistor P101, a drain terminal of the transistor N102, and the Q terminal are connected to one another. A drain terminal of the transistor P100, a drain terminal of the transistor N101, a gate terminal of the transistor P101, a gate terminal of the transistor N102, and the QB terminal are connected to one another. The R terminal is connected to a gate terminal of the transistor N100. The S terminal is connected to a source terminal of the transistor N100 and to a source terminal of the transistor N102. The INITB terminal is connected to a source terminal of the transistor P101. A source terminal of the transistor P100 is connected to a VDD. A source terminal of the transistor N101 is connected to a VSS.

The clock outputting section 120 includes (i) a P-channel transistor P102, (ii) N-channel transistors N103 and N104, (iii) a CKa terminal (clock terminal), and (iv) an O terminal (output terminal). A gate terminal of the transistor N104 and the Q terminal are connected to each other. A gate terminal of the transistor N103, a gate terminal of the transistor P102, and the QB terminal are connected to one another. A drain terminal of the transistor N103, a drain terminal of the transistor N104, a drain terminal of the transistor P102, and the O terminal are connected to one another. A source terminal of the transistor N104, a source terminal of the transistor P102, and the CKa terminal are connected to one another. A source terminal of the transistor N103 is connected to the VSS.

FIG. 35 is a timing chart illustrating an operation of the shift register illustrated in FIG. 33. The following description will discuss the operation of the shift register.

(Initialization Operation)

First, an operation in a case where initialization is carried out in response to an initializing signal INITB becoming active (having a low electric potential) will be described.

In a case where the electric potential of an INITB signal becomes low while the SR unit circuit is active (electric potentials at nodes Q and QB being high and low, respectively), the node Q (Q terminal) becomes connected to the INITB terminal, so that the electric potential at the node Q changes from a high level to a low level. This is because the transistor P101 is turned on. In a case where the electric potential at the node Q starts decreasing to the low level, the transistor N101 becomes turned off. This causes the transistor P100 to start becoming turned on, and therefore causes the electric potential at the node QB (QB terminal) to change from a low level to a high level.

In a case where the electric potentials at the Q terminal and at the QB terminal ultimately become low and high, respectively, the transistors N104 and P102 become turned off, and therefore the O terminal and the CKa terminal become disconnected from each other. In so doing, the transistor N103 becomes turned on, and therefore the O terminal outputs a signal having a low electric potential. Thereafter, the SR unit circuit remains inactive (the electric potentials at the nodes Q and QB being low and high, respectively) even in a case where the initializing signal INITB becomes inactive (having a high electric potential).

In a case where SR unit circuit is inactive immediately before the electric potential of the initializing signal INITB becomes low, the transistor P101 is turned off. This prevents the node Q from receiving the initializing signal INITB. However, since the SR unit circuit is already inactive, the O terminal is outputting a signal having a low electric potential. This causes the SR unit circuit to remain inactive even in a case where the electric potential of the initializing signal INITB becomes high.

The initializing signal INITB is supplied to each stage (the SR unit circuits of all stages) of the shift register. Therefore, in a case where the initializing signal INITB becomes active (having a low electric potential), the shift register is thus initialized. This allows the electric potentials of output signals from all the stages to be low.

(Operation of Flip-Flop)

Next, an operation of a flip-flop 110 will be described with reference to FIG. 34. Note that the electric potential of the initializing signal INITB is assumed to high.

The flip-flop in an inactive state has a high electric potential at the node QB (QB terminal). Hence, in a case where an active signal (having a high electric potential) is supplied to the S terminal (set terminal), the transistor N102 becomes turned on, and therefore the S terminal and the node Q (Q terminal) become connected to each other. This causes the electric potential at the node Q to change from a low level to a high level. In a case where the electric potential at the node Q changes to the high level, (i) the transistor N101 changes to an on state and (ii) the transistor P100 changes to an off state. This causes the electric potential at the node QB to change from a high level to a low level. Therefore, in a case where the S terminal becomes active, the flip-flop 110 becomes active (the electric potentials at the nodes Q and QB being high and low, respectively) as well.

In a case where an active signal (having a high electric potential) is supplied to the R terminal (reset terminal), the transistor N100 becomes turned on. This causes the S terminal and the node Q to be connected to each other. In so doing, an inactive signal (having a low electric potential) is supplied to the S terminal. This causes the electric potential at the node Q to change from the high level to the low level. In a case where the electric potential at the node Q changes to the low level, (i) the transistor P100 changes to an on state and (ii) the transistor N101 changes to an off state. This causes the electric potential at the node QB to change from the low level to the high level. Therefore, in a case where the R terminal becomes active, the flip-flop 110 becomes inactive (the electric potentials at the nodes Q and QB being low and high, respectively).

In a case where the S terminal and the R terminal both become inactive (having low electric potentials), (i) the transistor N100 is turned off and (ii) an inverter, which is made up of the transistors P100 and N101, and an inverter, which is made up of the transistors P101 and N102, are in a latched state. This causes a previous state to be maintained. Specifically, in a case where the S terminal and the R terminal both become inactive after the S terminal becomes active, the active state of the flip-flop 110 is maintained. On the other hand, in a case where the S terminal and the R terminal both become inactive after the R terminal becomes active, the inactive state of the flip-flop 110 is maintained.

(Operation of Clock Outputting Section)

The clock outputting section 120 receives output signals (Q, QB) from the flip-flop 110. In a case where the flip-flop 110 is active, (i) transistor N103 becomes turned off and (ii) the transistors P102 and N104 become turned on. This causes the O terminal and the CKa terminal of the SR unit circuit to be connected to each other, and therefore causes an output signal (O signal) to be outputted in accordance with an electric potential at the CKa terminal.

In a case where the flip-flop 110 is inactive, (i) the transistor N103 becomes turned on and (ii) the transistors P102 and N104 become turned off. This causes an electric potential of the output signal (O signal) from the SR unit circuit to be low.

(Operation of Shift Register)

In a case where a start pulse ST is supplied (set) to an S terminal of an SR unit circuit (SR100(1)) which is a first stage of the shift register illustrated in FIG. 33, a flip-flop 110 of the SR1 becomes active (an electric potential at Q1 being high). This causes a clock signal CK1, which is supplied to a CKa terminal of a clock outputting section 120, to be supplied to an O1 terminal. In a case where an electric potential of the clock signal CK1 changes from a low level to a high level, an active signal (having a high electric potential) is supplied to an S terminal of a second-stage SR unit circuit (SR100(2)), to which S terminal an output signal O1 is to be supplied. This causes a flip-flop 110 of the SR100(2) to become active (an electric potential at Q2 being high), and therefore causes a clock signal CK2, which is supplied to a CKa terminal of a clock outputting section 120, to be supplied to an O2 terminal. The O2 terminal is connected to an R terminal of the SR100(1) and to an S terminal of an SR100(3).

In a case where an electric potential of the clock signal CK2 becomes high after (i) the electric potential of clock signal CK1 changes from the high level to the low level and (ii) the electric potential of the output signal O1 becomes low, an electric potential of an output signal O2 becomes high. This causes a signal having a high electric potential to be supplied to the R terminal of the SR100(1). Therefore, (I) the flip-flop 110 of the SR100(1) becomes inactive (reset) and (II) a low electric potential of the output signal O1 is maintained. In addition, a signal having a high electric potential is supplied from the O2 terminal to the S terminal of the SR100(3). This causes a flip-flop of the SR100(3) to become active.

In a case where the electric potential of the clock signal CK2 changes from a high level to a low level, (i) the electric potential of the output signal O2 becomes low and (ii) the electric potentials of the S terminal and the R terminal of the SR100(1) become low. This causes the inactive state of the flip-flop 110 of the SR100(1) to be maintained. In a case where the present embodiment of the clock signal CK1 changes from a low level to a high level, a signal having a high electric potential is outputted from an O3 terminal of the SR100(3) and is then supplied to an R terminal of the SR100(2) which R terminal is connected to the O3 terminal. This causes the flip-flop of the SR100(2) to be inactive. In a case where (a) the present embodiment of the clock signal CK1 changes from a high level to a low level and (b) an electric potential of an output signal O3 becomes low, the electric potentials of the S terminal and the R terminal of the SR100(2) both become low. This causes the inactive state of the flip-flop 110 of the SR100(2) to be maintained.

The shift register thus causes a signal to be sequentially supplied to S terminals and R terminals of flip-flops 110 as well as causes a pulse to be sequentially outputted from O terminals.

Note that it is necessary to supply a signal to an R terminal of a last outputting stage SR100(n) of the shift register in order to cause a flip-flop 110 of the SR100(n) to be inactive after a pulse is outputted from an On terminal of the SR100(n). According to the conventional shift register, a dummy-stage SR100(d), which has a configuration identical to those of the SR unit circuits of other stages, is connected as a circuit for resetting the last outputting-stage SR100(n) (see FIG. 33). An output signal Od from the dummy-stage SR100(d) is supplied to inverters of a plurality of stages which are designed for delaying a pulse. Output from the inverters is supplied to an R terminal of the dummy-stage SR100(d) and to the R terminal of the last outputting-stage SR100(n).

In a case where an electric potential of an output signal On from the SR100(n) becomes high, the output signal On is supplied to an S terminal of the SR100(d). This causes a flip-flop 110 of the SR100(d) to be active. In a case where the electric potential of the clock signal CK1 supplied to the dummy-stage SR100(d) becomes high after (i) the electric potential of the clock signal CK2 becomes low and (ii) a pulse of the output signal On is outputted, a signal having a high electric potential is outputted from an Od terminal. A pulse of the output signal Od is delayed by the inverters, and is then supplied to the R terminal of the SR100(n) and to the R terminal of the SR100(d). This causes the flip-flops 110 of the SR100(n) and of the SR100(d) to become inactive (reset), and therefore causes the electric potential of the output signal Od to be low.

Since the flip-flop 110 of the last outputting-stage SR100(n) is thus made inactive and a resetting signal is thus supplied to the dummy-stage SR100(d), the flip-flop 110 of the dummy-stage can also be made inactive. Note that the reason for delaying the pulse of the output signal Od is to secure a time required for resetting the dummy-stage SR100(d).

CITATION LIST

Patent Literature

Patent Literature 1
PCT International Publication, No. WO2010/146756 (Publication Date: Dec. 23, 2010)

SUMMARY OF INVENTION

Technical Problem

The conventional technology, however, poses a problem that wiring is extended from an output terminal of a given stage to a reset terminal (R terminal) of a previous stage for a signal to be supplied to the reset terminal, and therefore a layout size becomes large. In addition, a dummy stage is necessary for resetting the last outputting stage of a shift register, and therefore a circuit region becomes large.

The present invention has been made in view of the problem, and it is an object of the present invention to reduce a circuit size of a shift register.

Solution to Problem

In order to attain the object, a shift register of the present invention includes stages each including: a holding circuit; and a clock output circuit, the holding circuit including a first CMOS circuit including a P-channel first transistor and an N-channel second transistor which have respective gate terminals that are connected to each other and which have respective drain terminals that are connected to each other, a second CMOS circuit including a P-channel third transistor and an N-channel fourth transistor which have respective gate terminals that are connected to each other and which have respective drain terminals that are connected to each other, a plurality of input terminals, a first output terminal and a second output terminal, and a reset transistor having (i) a source terminal connected to the plurality of input terminals, (ii) a drain terminal connected to the first CMOS circuit and to the second CMOS circuit, and (iii) a gate terminal that receives a first clock signal, the gate terminals of the first CMOS circuit, the drain terminals of the second CMOS circuit, and the first output terminal being connected to one another, and the drain terminals of the first CMOS circuit, the gate terminals of the second CMOS circuit, and the second output terminal being connected to one another, the clock output circuit including an output terminal that outputs an output signal having a high electric potential or a low electric potential, depending on at least one of output signals from the holding circuit and on a second clock signal, and the holding circuit carrying out a reset operation in accordance with the first clock signal supplied to the reset transistor.

Advantageous Effects of Invention

As described above, a shift register of the present invention is configured such that: a clock output circuit including an output terminal that outputs an output signal having a high electric potential or a low electric potential, depending on at least one of output signals from a holding circuit and on a second clock signal; and the holding circuit carrying out a reset operation in accordance with a first clock signal supplied to a reset transistor. This allows a reduction in circuit size of a shift register.

DESCRIPTION OF EMBODIMENTS

Figure 1:
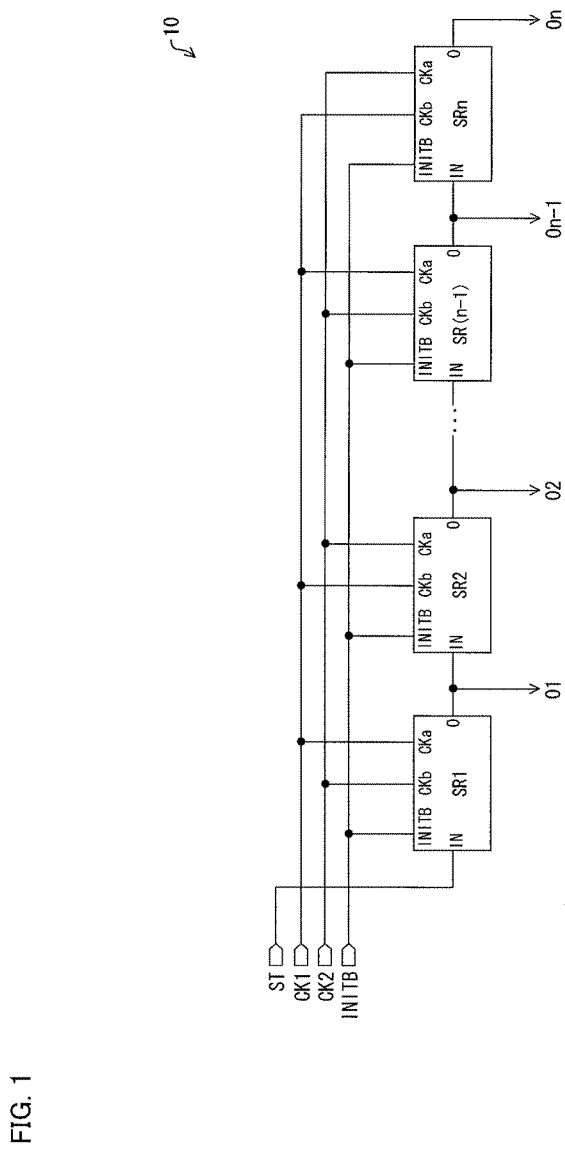
FIG. 1 is a block diagram schematically illustrating a configuration of a shift register in accordance with the present embodiment.

The following description will discuss an embodiment of the present invention. FIG. 1 is a block diagram schematically illustrating a configuration of a shift register 10 in accordance with the present embodiment.

As illustrated in FIG. 1, the shift register 10 is configured by connecting, in multi-stages, n (n is an integer that is equal to or greater than 2) SR unit circuits. Each of the SR unit circuits includes clock terminals (CKa terminal, CKb terminal), an input terminal (IN terminal), an initializing terminal (INITB terminal), and an output terminal (O terminal). Hereinafter, a given stage is referred to as a k-th stage (k is an integer that is equal to or greater than 1 and equal to or less than n).

The shift register 10 is to be supplied, from an external source, (i) with a start pulse ST and (ii) with, via two clock main wires, clock signal CK1 and CK2 of respective phases. The start pulse ST is supplied to an IN terminal of an SR unit circuit SR1 which is a first stage. The clock signal CK1 is supplied to CKa terminals of odd-numbered SR unit circuits and to CKb terminals of even-numbered SR unit circuits. The clock signal CK2 is supplied to CKb terminals of the odd-numbered SR unit circuits and to CKa terminals of the even-numbered SR unit circuits. An output signal Ok of a k-th-stage SR unit circuit SRk is outputted from an O terminal and is then supplied to an IN terminal of a following stage ((k+1)th-stage) SR unit circuit SR (k+1).

Specifically, an example of an SR unit circuit SR2, which is a second-stage of the shift register 10, is as follows (as illustrating in FIG. 1): An output signal O1 from the first-stage SR unit circuit SR1 is supplied to an IN terminal of the SR unit circuit SR2. The clock signal CK2 is supplied to a CKa terminal of the SR unit circuit SR2. The clock signal CK1 is supplied to a CKb terminal of the SR unit circuit SR2. An output signal O2 of the SR unit circuit SR2 is outputted from an O terminal of the SR unit circuit SR2 and is then supplied to an IN terminal of an SR unit circuit SR3 which is a third stage of the shift register 10. According to the shift register 10, a shift operation is thus carried out so that output signals O1 through On are sequentially outputted.

The configuration of the shift register 10 will be described below in detail. Note that a k-th-stage SR unit circuit will be employed as an example unless specifically stated otherwise.

Example 1

Figure 2:
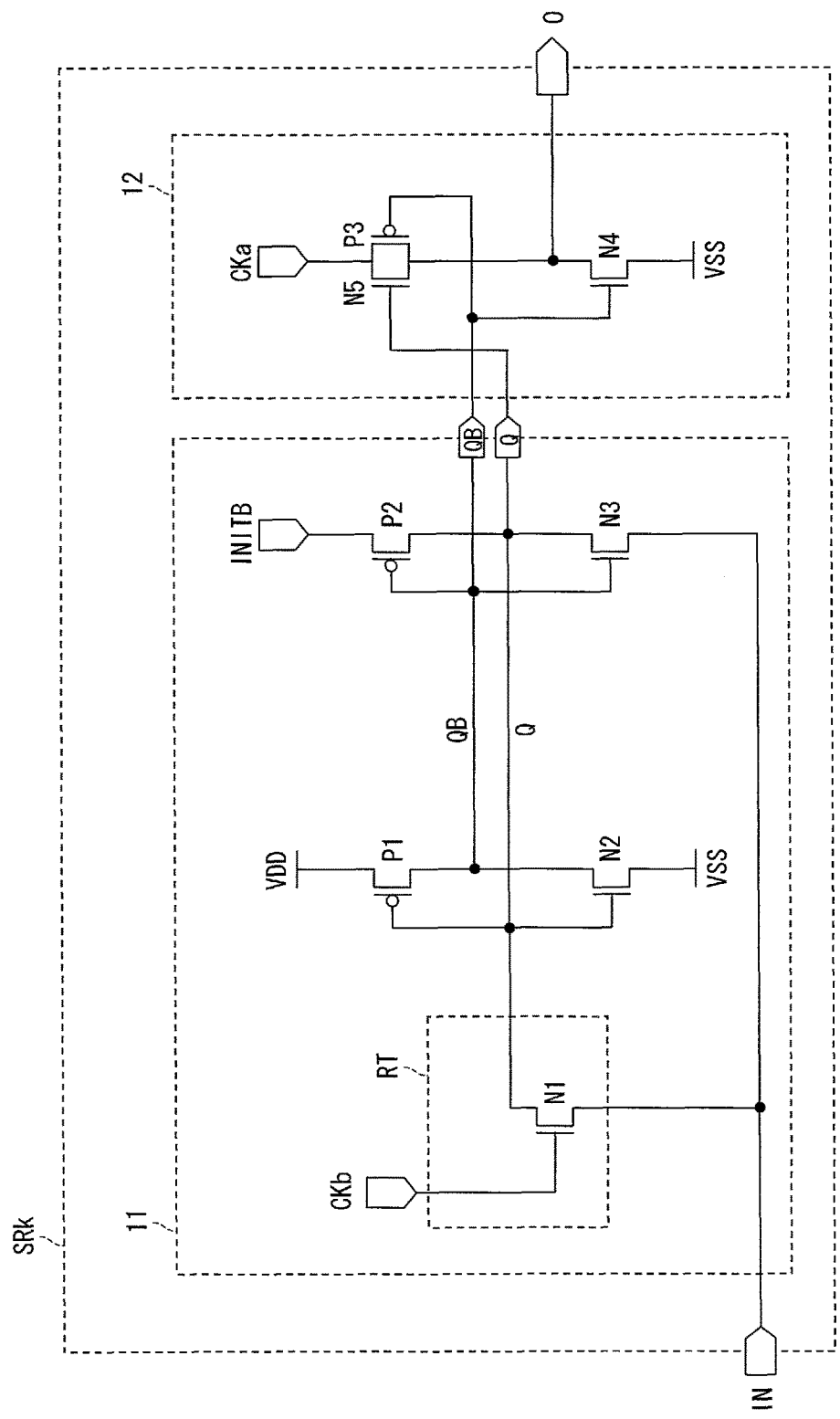
FIG. 2 is a circuit diagram illustrating an SR unit circuit of a shift register in accordance with Example 1.

FIG. 2 is a circuit diagram illustrating an SR unit circuit of a shift register 10 in accordance with Example 1. As illustrated in FIG. 2, an SR unit circuit SRk includes a holding circuit 11 and a clock outputting section 12. The holding circuit 11 includes (i) a P-channel transistor P1 and an N-channel transistor N2 of which a CMOS circuit (first CMOS circuit) is made up, (ii) a P-channel transistor P2 and an N-channel transistor N3 of which a CMOS circuit (second CMOS circuit) is made up, (iii) an N-channel transistor N1, (iv) an IN terminal, (v) a CKb terminal, (vi) an INITB terminal, (vii) a Q terminal (output terminal), and (viii) a QB terminal (output terminal). A gate terminal of the transistor P1, a gate terminal of the transistor N2, a drain terminal of the transistor N1, a drain terminal of the transistor P2, a drain terminal of the transistor N3, and the Q terminal are connected to one another. A drain terminal of the transistor P1, a drain terminal of the transistor N2, a gate terminal of the transistor P2, a gate terminal of the transistor N3, and the QB terminal are connected to one another. The CKb terminal is connected to connected to a gate terminal of the transistor N1. The IN terminal is connected to a source terminal of the transistor N1 and to a source terminal of the transistor N3. The INITB terminal is connected to a source terminal of the transistor P2. A source terminal of the transistor P1 is connected to a VDD (power source). A source terminal of the transistor N2 is connected to a VSS (power source). The transistor N1 configures a reset circuit RT. Note that a node Q indicates a point via which the gate terminal of the transistor P1, the gate terminal of the transistor N2, the drain terminal of the transistor P2, and the drain terminal of the transistor N3 are connected to one another. Note also that a node QB indicates a point via which the drain terminal of the transistor P1, the drain terminal of the transistor N2, the gate terminal of the transistor P2, and the gate terminal of the transistor N3 are connected to one another.

The clock outputting section 12 includes (i) a P-channel transistor P3, (ii) N-channel transistors N4 and N5, (iii) a CKa terminal, and (iv) an O terminal. A gate terminal of the transistor N5 is connected to the Q terminal. A gate terminal of the transistor N4, a gate terminal of the transistor P3, and the QB terminal are connected to one another. A drain terminal of the transistor N4, a drain terminal of the transistor N5, a drain terminal of the transistor P3, and the O terminal are connected to one another. A source terminal of the transistor N5, a source terminal of the transistor P3, and the CKa terminal are connected to one another. A source terminal of the transistor N4 is connected to the VSS.

(Operation)

Figure 3:
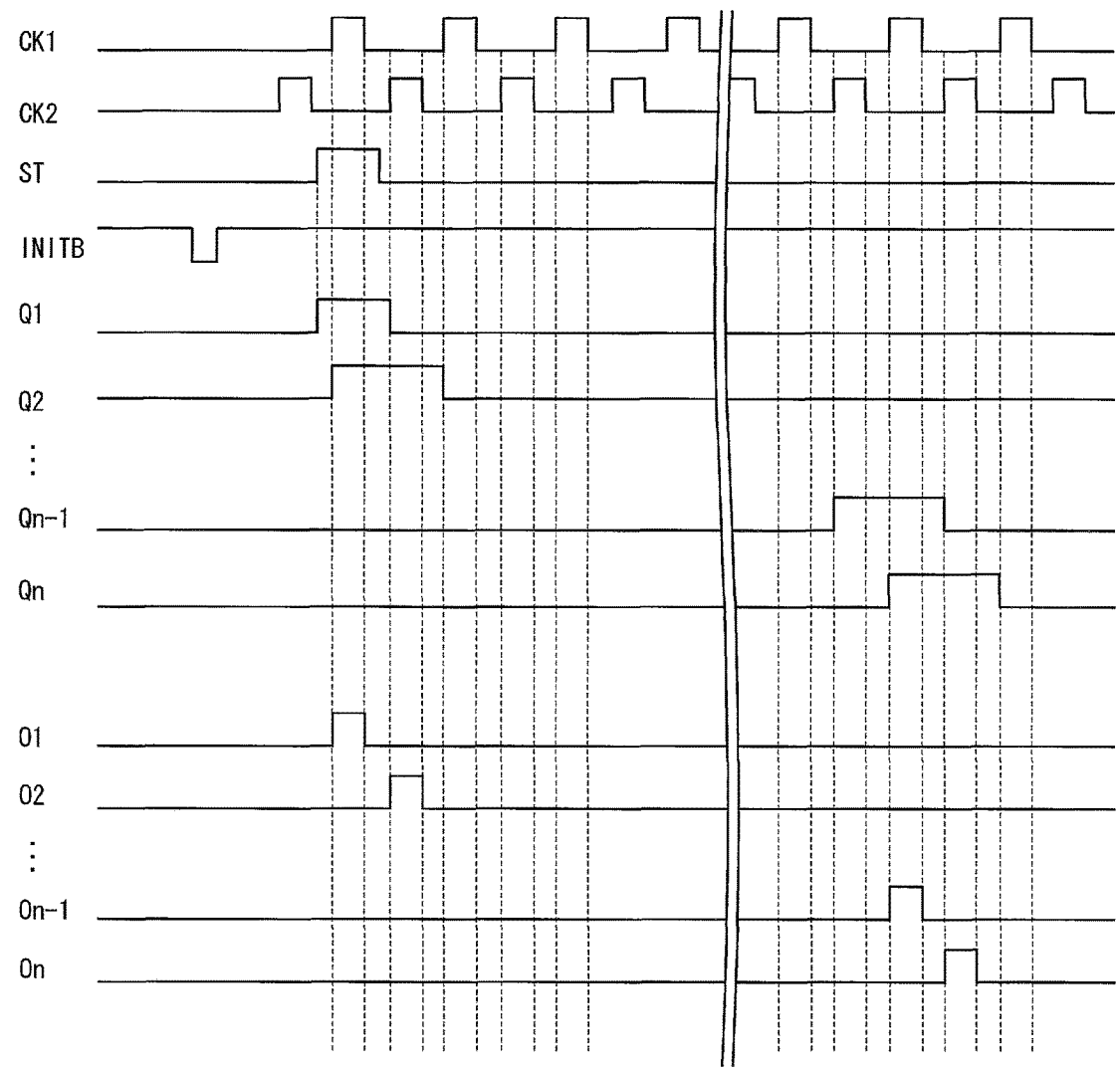
FIG. 3 is a timing chart of the shift register of Example 1 in operation.

An operation of the shift register 10 will be described below with reference to FIG. 3. FIG. 3 is a timing chart of the shift register 10 in operation. FIG. 3 shows input and output signals from a first-stage SR unit circuit SR1, a second-stage SR unit circuit SR2, an (n−1)th-stage SR unit circuit SR (n−1), and an n-th-stage SR unit circuit SRn.

A CK1 is a clock signal to be supplied to (i) CKa terminals of odd-numbered SR unit circuits and (ii) CKb terminals of even-numbered SR unit circuits. A CK2 is a clock signal to be supplied to (a) CKb terminals of odd-numbered SR unit circuits and (b) CKa terminals of even-numbered SR unit circuits. An ST is a start pulse to be supplied to an IN terminal of a first-stage SR unit circuit SR1. O1, O2, O(n−1), and On indicate electric potentials of output signals from the first, second, (n−1)th, and n-th SR unit circuits of the shift register, respectively.

First, in a case where an electric potential of the start pulse ST is high (active), an electric potential at the IN terminal of the first-stage SR unit circuit SR1 becomes high. Since an electric potential at a node Q1 is low and an electric potential at a node QB1 is high immediately before the start pulse ST is supplied, the transistor N3 is turned on. In a case where the present embodiment at the IN terminal becomes high, the IN terminal becomes connected to the node Q1 (Q1 terminal) via the transistor N3. This causes the electric potential at the node Q1 to be changed to a high level. In a case where the electric potential at the node Q1 exceeds an inversion electric potential of an inverter which is made up of the transistors P1 and N2, (i) the transistor P1 changes to an off state and (ii) the transistor N2 changes to an on state. This causes the electric potential at the node QB1 (QB1 terminal) to change from a high level to a low level. In a case where the electric potential at the node QB1 becomes low, (a) the transistor N3 becomes turned off, so that the IN terminal and the node Q1 become disconnected from each other and then (b) the transistor P2 becomes turned on, so that the electric potential at the node Q1 becomes high (VDD electric potential of the initializing signal INITB) which does not decrease lower than a threshold.

In a case where the electric potentials at the node Q1 and the node QB1 become high and low, respectively, (i) the transistors N5 and P3 of the clock outputting section 12 become turned on and the transistor N4 of the clock outputting section 12 become turned off and (ii) an O1 terminal becomes connected to a CKa terminal to which the clock signal CK1 is to be supplied. In a case where the electric potential of the clock signal CK1 changes from a low level to a high level, an electric potential at the O1 terminal likewise changes from a low level to a high level. This causes an output signal O1 of the shift register to be outputted.

Since the O1 terminal is connected to an IN terminal of a next-stage (second-stage) SR unit circuit SR2, electric potentials at nodes Q2 and QB2 become high and low, respectively, as is the case of the first-stage SR unit circuit SR1. In a case where the electric potential of the clock signal CK2 changes from a low level to a high level after the electric potentials of the clock signal CK1 and the output signal O1 both become low, an O2 terminal, whose electric potential is high, is outputted from the output signal O2. At the same time, an electric potential at the CKb terminal of the SR unit circuit SR1, to which the clock signal CK2 is supplied, changes from a low level to a high level. This causes a transistor N1 of the SR unit circuit SR1 to be turned on.

According to the SR unit circuit SR1, the transistor P2 and the transistors N1 and P2 are turned on immediately before the electric potential of the clock signal CK2 becomes high. This causes the IN terminal and the INITB terminal to be connected to each other (VDD electric potential; power source electric potential VDD if a power source VDD is supplied instead of the INITB terminal). In a case where (i) the driving performance of the transistor N1 is greater than that of the transistor P2 and (ii) the electric potential at the IN terminal changes from a high level to a low level (VSS electric potential), the electric potential at the node Q1 changes to an electric potential value that is lower than a mean value of the VDD electric potential and the VSS electric potential. In a case where the electric potential at the node Q1 decreases lower than an inversion electric potential of an inverter made up of the transistors P2 and N2, the electric potential at the node QB1 changes from a high level to a low level. In a case where the electric potential at the node QB1 moves toward the high level, the transistor P2 and the transistor N3 change to off and on states, respectively. This causes the INITB terminal and the IN terminal to be disconnected from each other, and then causes the low electric potential at the IN terminal to be supplied to the node Q1 via the transistor N3. This causes the holding circuit 11 of the SR unit circuit SR1 to be configured so that the electric potentials at the nodes Q1 and QB1 to be low and high, respectively.

In a case where the electric potential of the clock signal CK2 becomes low, the electric potential of the output signal O2 becomes low. In a case where the electric potential at the CKb terminal becomes low, the transistor N1 becomes turned off. This causes the holding circuit 11 of the SR unit circuit SR1 to serve as a latch circuit. Therefore, in a case where (i) the holding circuit 11 maintains its electric potential and (ii) the electric potentials at the nodes Q1 and QB1 are low and high, respectively, the O1 terminal continues to output an output signal whose electric potential is low (VSS electric potential). This is because the transistors N5 and P3 and the transistor N4 of the SR unit circuit SR1 are turned off.

The O2 terminal is connected to an IN terminal of the SR unit circuit SR3, and the output signal O2 is therefore supplied to the SR unit circuit SR3. The shift register 10 is capable of sequentially outputting output signals O1 through On by repeating the above operation.

Note that it is possible to secure an operating margin of a holding circuit 11 and to reduce a signal delay within the holding circuit 11 by causing driving performance of a transistor N1 to be greater than that of a transistor P2. This can be achieved by, for example, (i) a method in which a width of the transistor N1 is to be made wide (a width of the transistor P2 is to be made narrow) or (ii) a method in which a length of the transistor P2 is to be made long (a length of the transistor N1 is to be made short).

Alternatively, it is also possible to secure the operating margin and to reduce the signal delay by making an adjustment so as to increase an inversion electric potential of an inverter which is made up of transistors P1 and N2. This can be achieved by, for example, (i) a method in which a width of the transistor P1 is to be made wide (a length is to be made short) or (ii) a method in which a width of the transistor N2 is to be made narrow (a length is to be made long). This causes the driving performance of the transistor P1 to be greater than that of the transistor N2, and therefore allows an increase in the inversion electric potential of the inverter which is made up of the transistors P1 and N2.

Figure 33:
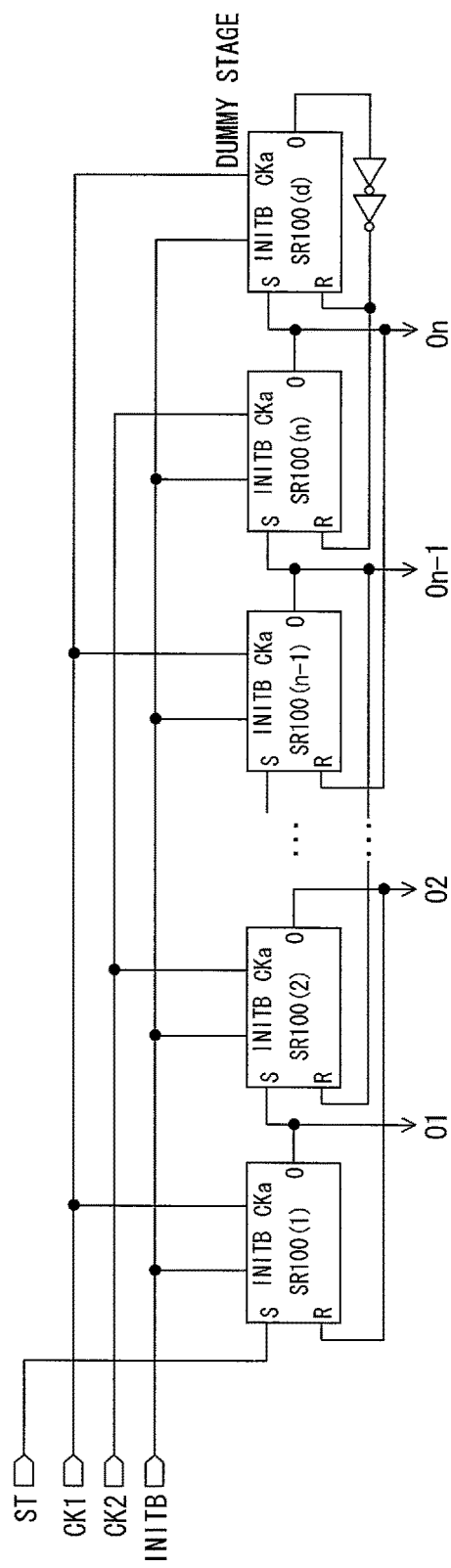
FIG. 33 is a block diagram schematically illustrating a configuration of a conventional shift register.
Figure 34:
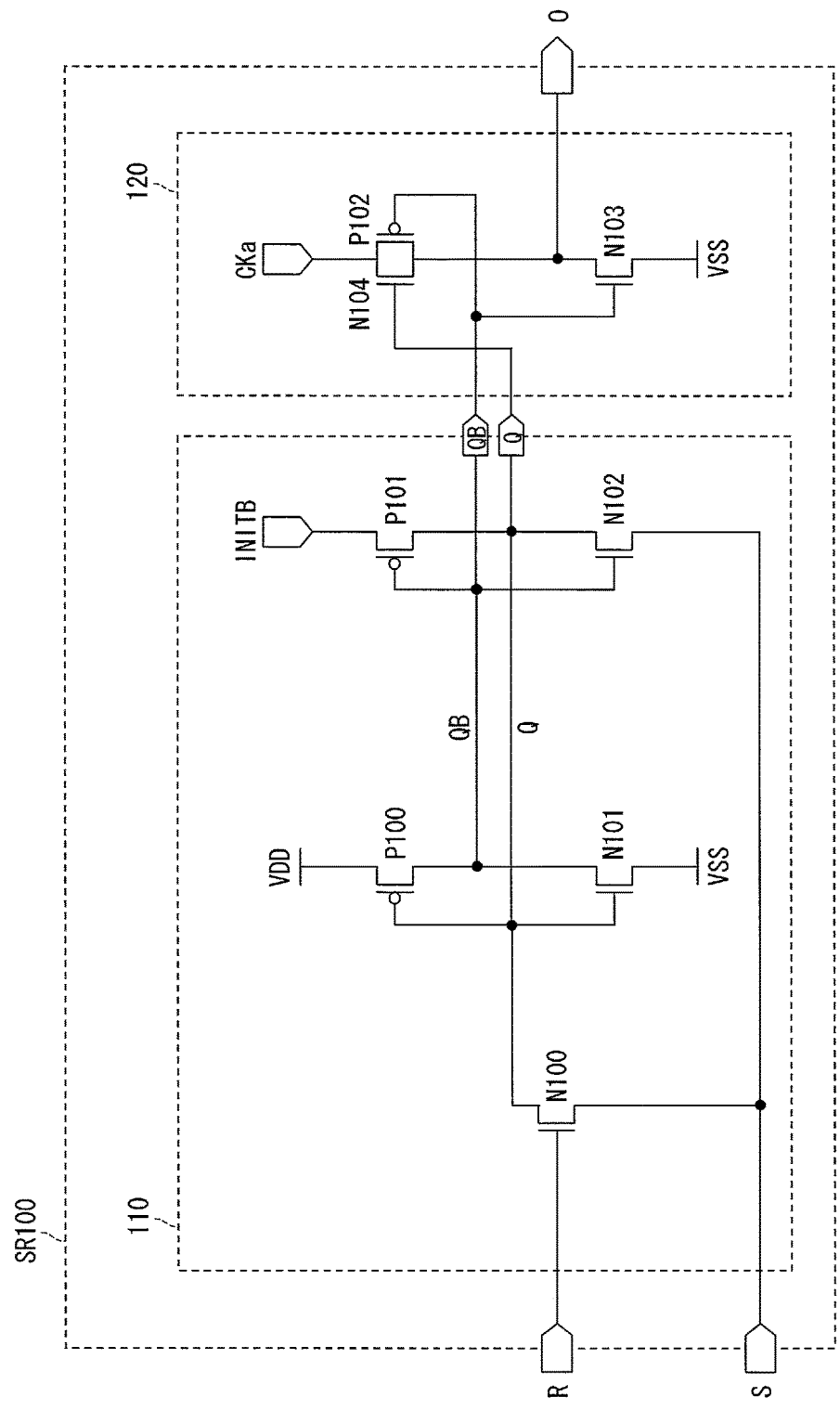
FIG. 34 is a circuit diagram illustrating an SR unit circuit by which the conventional shift register is configured.
Figure 35:
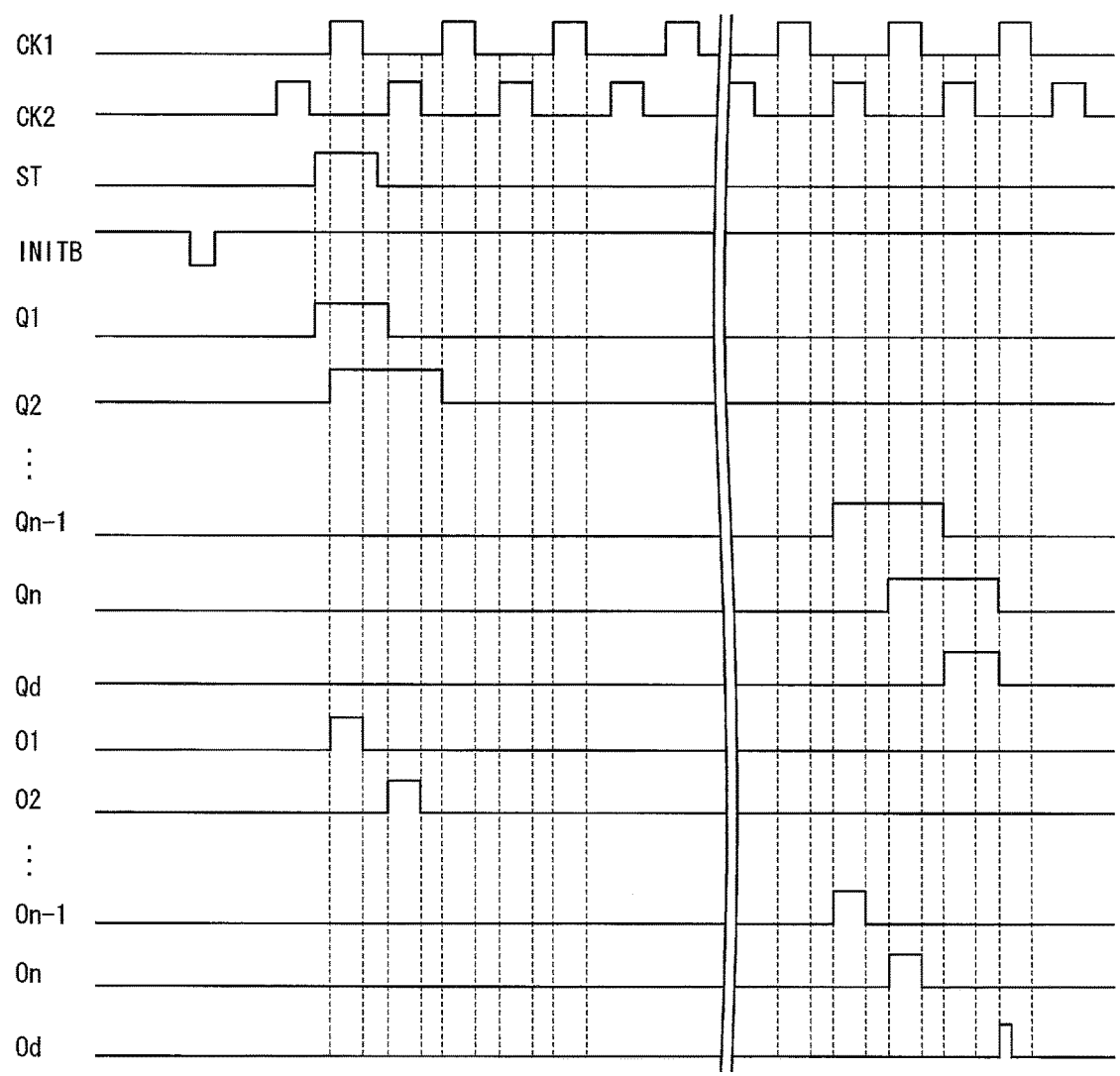
FIG. 35 is a timing chart of the conventional shift register in operation.

According to such a configuration, (i) without increasing the number of transistor elements of an SR unit circuit, it is possible to eliminate lead wiring for an output signal following-stage SR unit circuit, which lead wiring is conventionally necessary and (ii) a dummy stage (see FIG. 33) for resetting a last-stage SR unit circuit SRn is unnecessary. This allows a reduction in circuit size of a shift register.

(Initialization Operation)

The following description will discuss an operation in a case where initialization is carried out while an initializing signal INITB is active (having a low electric potential). A configuration for the initialization operation is identical to the conventional configuration.

In a case where an electric potential of an INITB terminal becomes low while an SR unit circuit SRk is active (electric potentials at nodes Qk and QBk being high and low, respectively), the node Qk (Qk terminal) becomes connected to the INITB terminal, so that the electric potential at the node Qk changes from a high level to a low level. This is because the transistor P2 is turned on while the SR unit circuit SRk is active. In a case where the electric potential at the node Qk starts decreasing to the low level, a transistor N2 becomes turned off. This causes a transistor P1 to start becoming turned on, and therefore causes the electric potential at the node QBk (QBk terminal) to change from a low level to a high level.

In a case where the electric potentials at the node Qk and at the node QBk ultimately become low and high, respectively, transistors N5 and P3 become turned off, and therefore an O terminal and a CKa terminal become disconnected from each other. In so doing, a transistor N4 becomes turned on, and therefore the O terminal outputs a signal having a low electric potential. Thereafter, the SR unit circuit SRk remains inactive (the electric potentials at the nodes Qk and QBk being low and high, respectively) even in a case where the initializing signal INITB becomes inactive (having a high electric potential).

In a case where SR unit circuit SRk is inactive immediately before the electric potential of the initializing signal INITB becomes low, the transistor P2 is turned off. This prevents the node Qk from receiving the initializing signal INITB. However, since the SR unit circuit SRk is already inactive, the O terminal is outputting a signal whose electric potential is low. This causes the SR unit circuit SRk to remain inactive even in a case where the electric potential of the initializing signal INITB becomes high.

An initializing signal INITB is supplied to each stage (the SR unit circuits of all stages) of the shift register. Therefore, in a case where the initializing signal INITB becomes active (having a low electric potential), the shift register is thus initialized. This allows the electric potentials of output signals from all the stages to be low.

(Modifications of Example 1)

Figure 4:
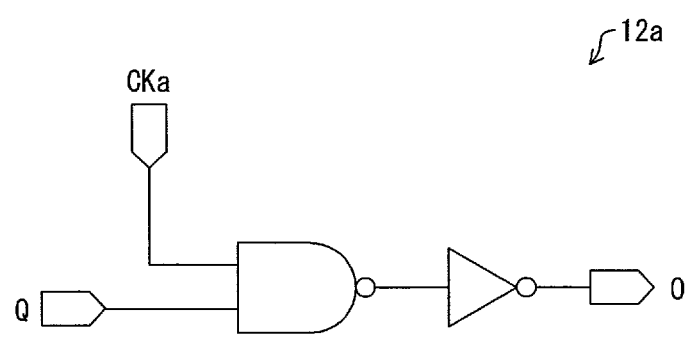
FIG. 4 is a view illustrating a modification of a clock outputting section constituting the SR unit circuit of the shift register in accordance with Example 1.

FIG. 4 is a view illustrating a modification of a clock outputting section 12 by which an SR unit circuit of a shift register 10 in accordance with Example 1 is configured. A clock outputting section 12a illustrated in FIG. 4 is configured by a NAND circuit and an inverter. One end of the NAND circuit is connected to a Q terminal. The other end of the NAND circuit is connected to a CKa terminal. An output terminal of the NAND circuit is connected to an input terminal of the inverter. An output terminal of the inverter is connected to an O terminal.

Figure 5:
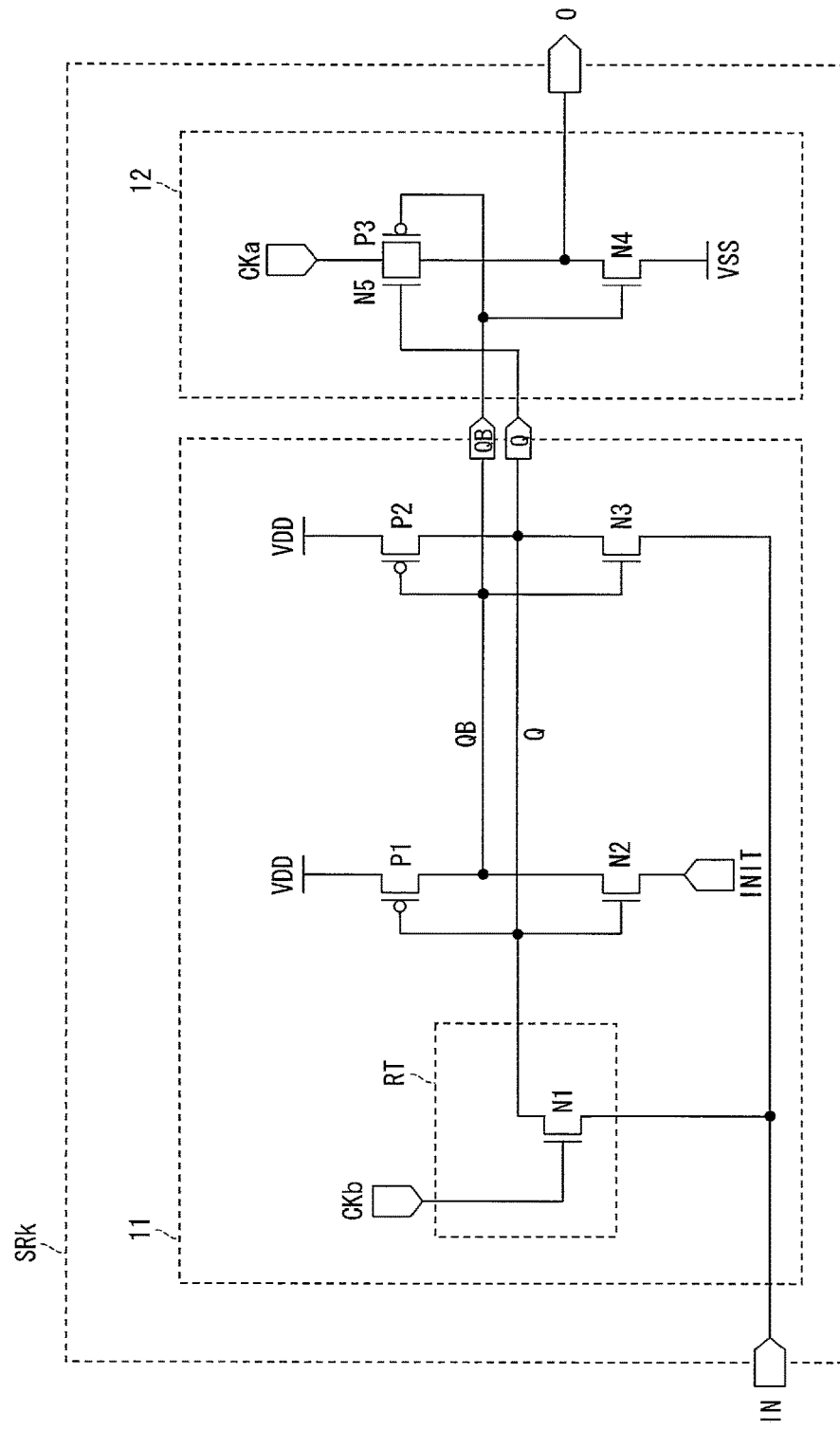
FIG. 5 is a view illustrating a modification of the SR unit circuit of the shift register in accordance with Example 1.

FIG. 5 is a view illustrating a modification of the SR unit circuit of the shift register 10 in accordance with Example 1. According to an SR unit circuit SRk illustrated in FIG. 5, (i) a source terminal of a transistor P2 is connected to a VDD (power source) and (ii) a source terminal of a transistor N2 is connected to an INIT terminal (an INIT signal is an inversion signal of an INITB signal). The rest of the configuration is identical to the configuration of the SR unit circuit SRk (FIG. 2) of Example 1.

Figure 6:
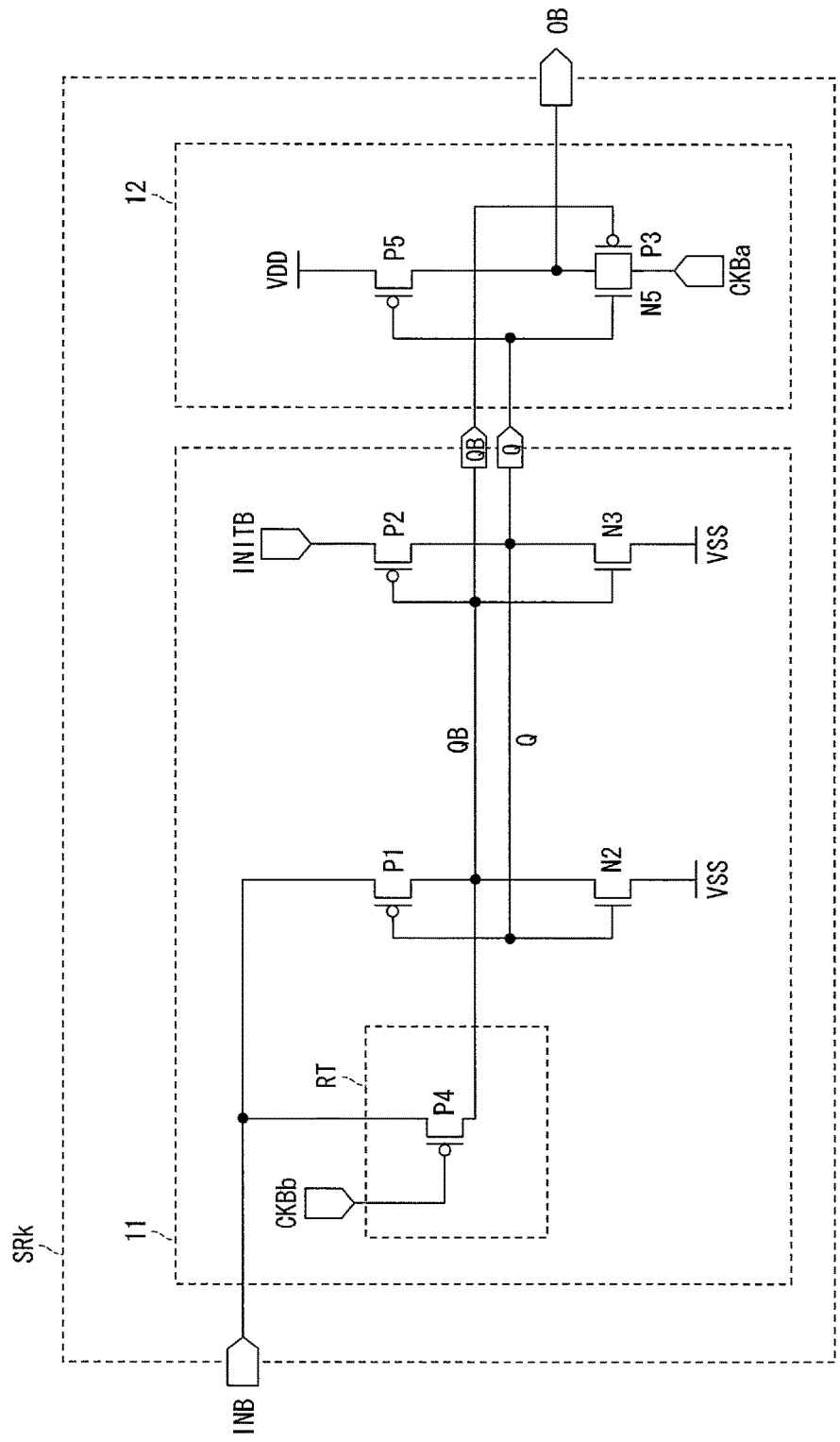
FIG. 6 is a view illustrating another modification of the SR unit circuit of the shift register in accordance with Example 1.
Figure 7:
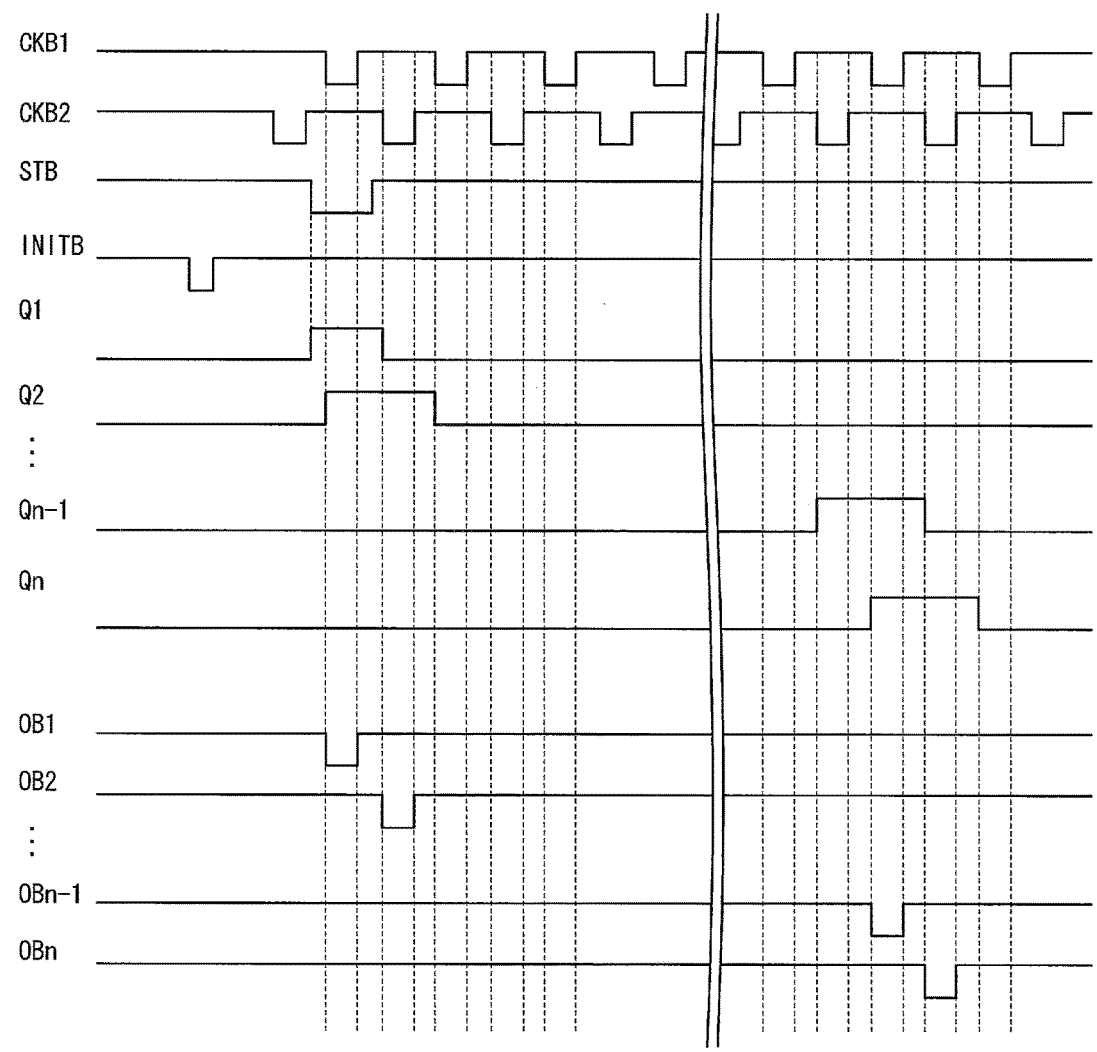
FIG. 7 is a timing chart of the shift register in operation that includes the SR unit circuit illustrated in FIG. 6.

FIG. 6 is a view illustrating another modification of the SR unit circuit of the shift register 10 in accordance with Example 1. An SR unit circuit SRk illustrated in FIG. 6 is configured so that logic of the start pulse ST, the clock signals CKa and CKb, the input signal IN, and the output signal O illustrated in FIG. 2 is inverted. FIG. 7 is a timing chart of an in-operation shift register 10 that includes the SR unit circuit SRk illustrated in FIG. 6.

Figure 8:
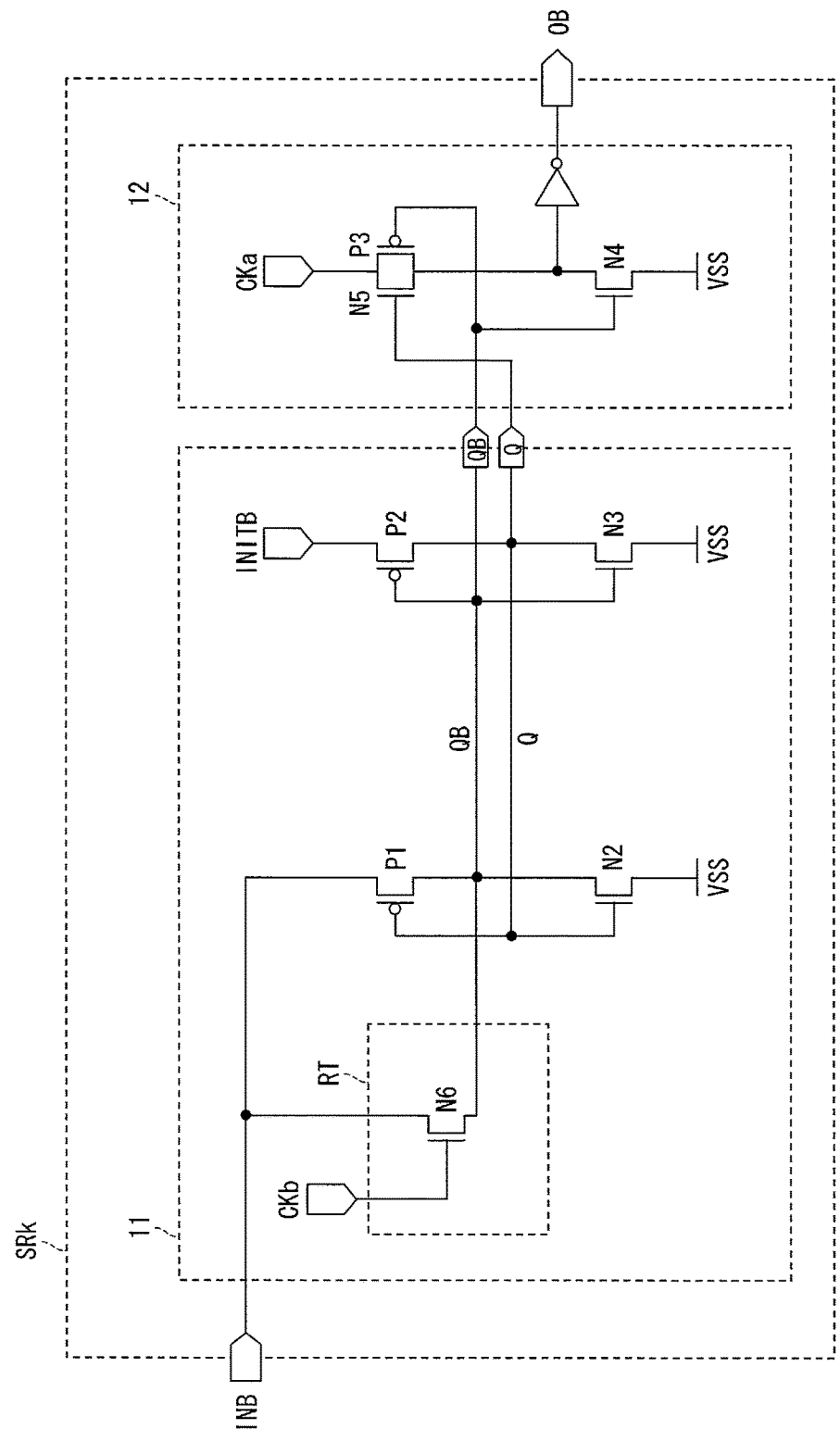
FIG. 8 is a view illustrating a further modification of the SR unit circuit of the shift register in accordance with Example 1.
Figure 9:
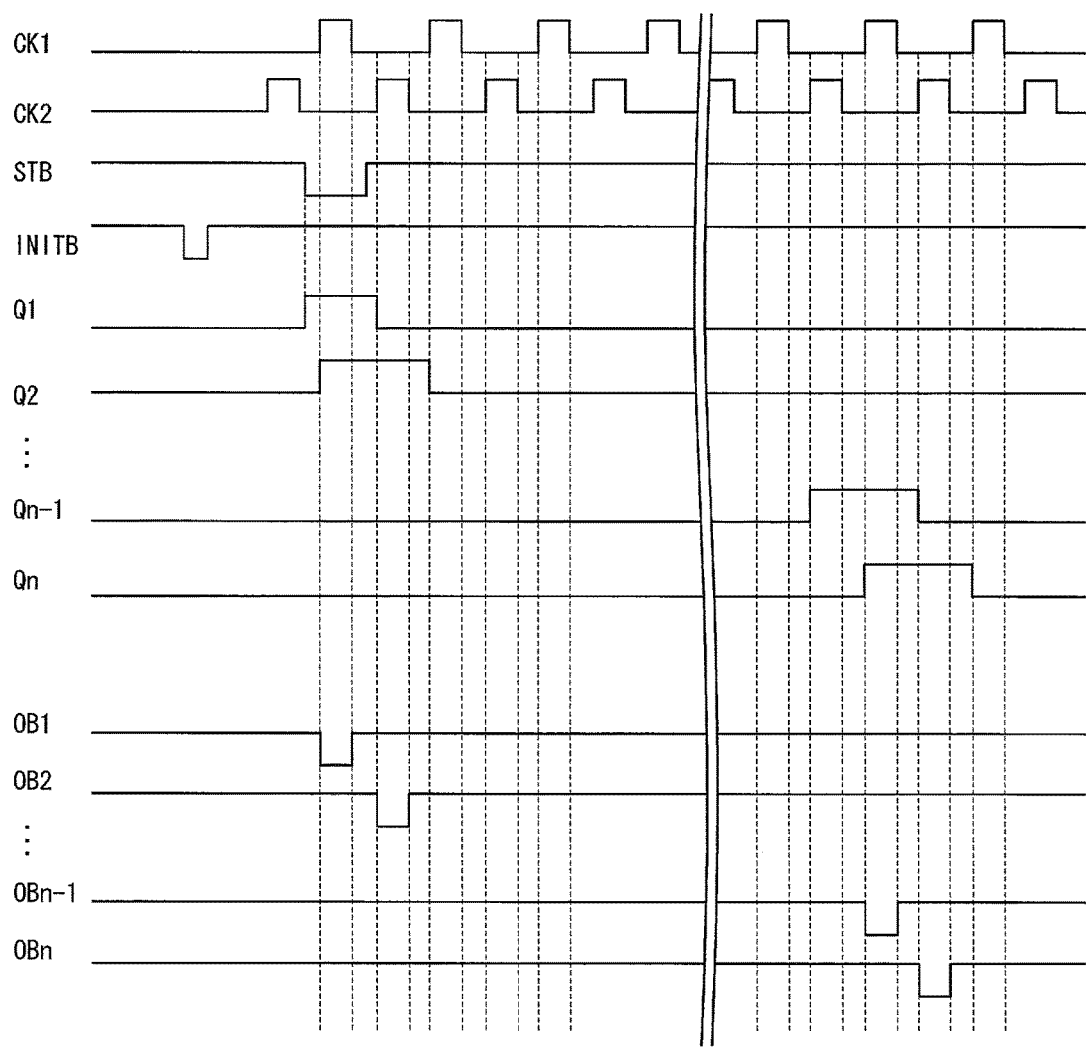
FIG. 9 is a timing chart of the shift register in operation that includes the SR unit circuit illustrated in FIG. 8.

The following is consideration of a reset circuit RT (see FIGS. 2, 5, and 6) of an SR unit circuit SR: Assume a case where a reset operation is carried out, specifically, a case where an electric potential at a node Q or a node QB is to be pulled by turning on a transistor N6 of the reset circuit RT so that a transition is made from a "Q=high, QB=low" state to a "Q=low, QB=high" state. In such a case, if an electric potential of an input signal INB is high while an electric potential at a gate terminal of the transistor N6 is high as illustrated in FIG. 8 for example, then an electric potential difference between the gate terminal and the source terminal is small. This causes an on-state resistance of the transistor N6 to become significantly high. Therefore, in order to cause an electric potential at a transistor N2, which electric potential is pulled from the transistor N6 and the node QB, to be lower than an inversion electric potential of an inverter made up of transistors P2 and N3 so that the respective electric potentials at the transistor N6 and the node QB are interchanged, it is necessary to either cause the width of the transistor N6 to be significantly wider (by several times wider to several dozens of times wider) or cause the length of the transistor N2 to be significantly longer. This results in an operating margin decrease which leads to an increase in circuit size. Note that FIG. 9 is a timing chart illustrating an in-operation shift register 10 which includes the SR unit circuit SRk illustrated in FIG. 8.

According to each of the reset circuits RT illustrated in FIGS. 2 and 5, the electric potentials at the gate terminal and the source terminal are high and low, respectively, when a reset operation is carried out. That is, an electric potential difference between gate terminal and the source terminal is present. This causes a resistance at the transistor N1 to be low, and therefore makes it easy to increase the driving performance of the transistor P2. Hence, it is possible to easily cause the electric potential at the node Q to be lower than the inversion electric potential of the inverter made up of the transistors P1 and N2.

Likewise, according to a reset circuit illustrated in FIG. 6, electric potentials at a gate terminal and a source terminal are low and high, respective, when a reset operation is carried out. That is, an electric potential difference between the gate terminal and the source terminal is present. This causes a resistance at a transistor P4 to be low, and therefore makes it easy to increase the driving performance of a transistor N2. Hence, it is possible to easily cause an electric potential at the node QB to be higher than an inversion electric potential of an inverter made up of the transistors P2 and N3. According to the reset circuits RT illustrated in FIGS. 2, 5, and 6, it is thus possible to secure an operating margin and to reduce a circuit size.

The reset circuit RT is thus configured to include, of all transistors included in the inverters of the holding circuit 11, a transistor having a polarity opposite of a polarity of a transistor(s) that (i) has a drain terminal connected to an output terminal of the reset circuit RT and (ii) is turned on while the holding circuit 11 is being active. Such a reset circuit RT is preferably configured so that a signal, which has a polarity opposite of a polarity of a signal to be supplied to a gate terminal so as to turn on the reset circuit RT while a reset operation is carried out, is supplied to a source terminal (which is not a drain terminal serving as an output terminal).

Example 2

Figure 10:
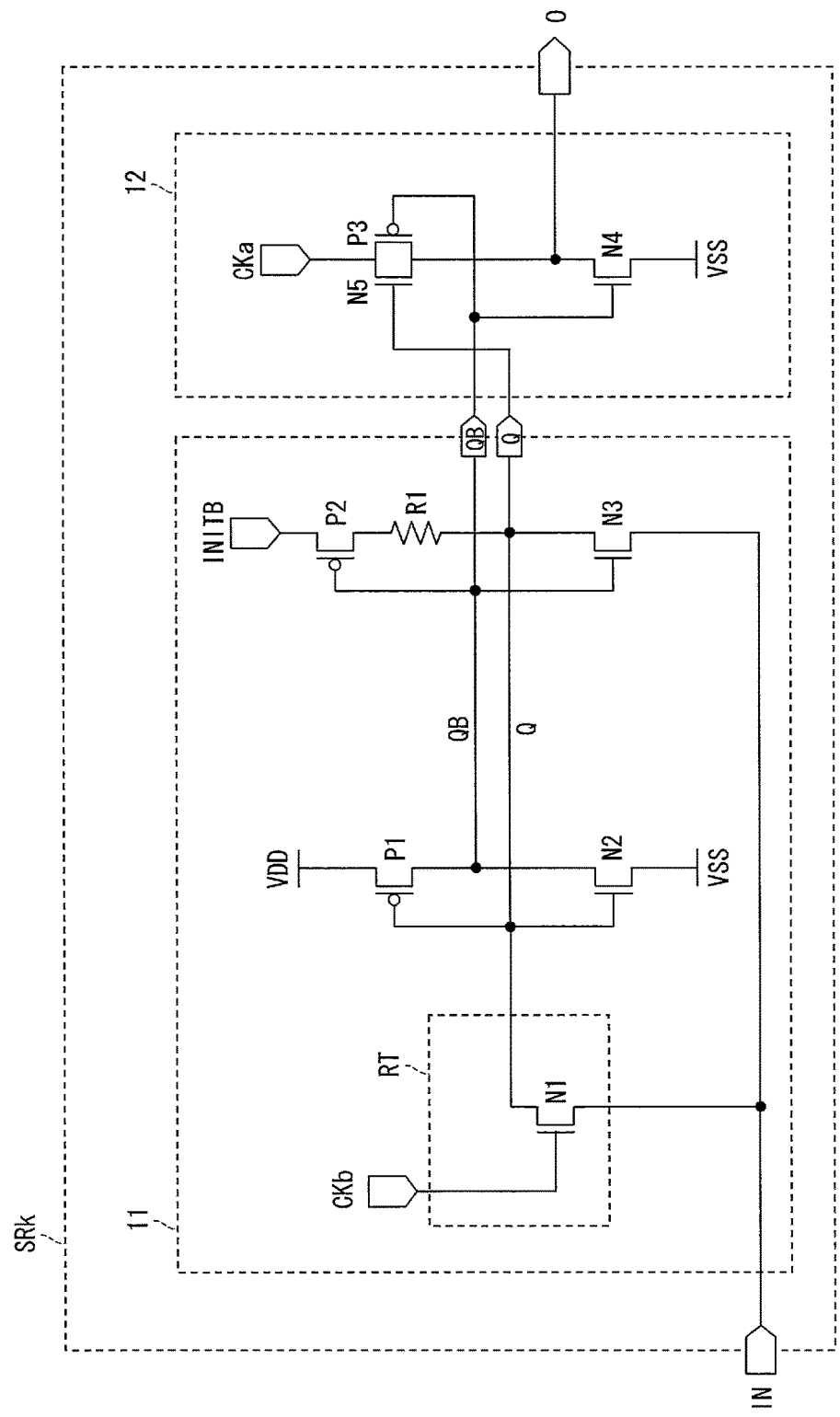
FIG. 10 is a circuit diagram illustrating an SR unit circuit of a shift register in accordance with Example 2.

FIG. 10 is a circuit diagram illustrating an SR unit circuit of a shift register 20 in accordance with Example 2. The shift register 20 is configured by providing a resistor R1 between the drain terminal of the transistor P2 and the node Q of the shift register 10 in accordance with Example 1. Specifically, as illustrated in FIG. 10, a drain terminal of a transistor P2 is connected to one end of a resistor R1, and the other end of the resistor R1 is connected to a drain terminal of a transistor N3 and to a node Q (Q terminal).

The following is consideration of a reset circuit RT (see FIGS. 2, 5, and 6) of an SR unit circuit: Assume a case where a reset operation is carried out, specifically, a case where an electric potential at a node Q or a node QB is to be pulled by turning on a transistor N6 of the reset circuit RT so that a transition is made from a "Q=high, QB=low" state to a "Q=low, QB=high" state. In such a case, according to the configuration of FIG. 2, the electric potential at the node Q is determined by an on-state resistance at the transistor N1 and an on-state resistance at the transistor P2. In a case where the electric potential at the node Q becomes lower than the inversion electric potential of the inverter made up of the transistors P1 and N2, it is possible to interchange the respective electric potentials at the nodes Q and QB by the operation of the latch circuit. Therefore, widening the width of the transistor N1 is effective in ensuring the operating margin. However, the widening the width of the transistor N leads to an increase in circuit size. In addition, although lengthening the length of the transistor P2 is also effective, it likewise causes the circuit size to be large.

Hence, it is preferable to provide the resistor R1 (several kΩ to several MΩ) as illustrated in FIG. 10. This easily allows the on-state electrical resistance of the transistor N1 to be lower than a total amount of the on-state electrical resistance of the transistor P2 and the electrical resistance of the resistor R1. Therefore, it is possible to secure an operating margin. In addition, providing the resistor R1 at a part (silicon), by which a channel of the transistor is configured, makes it possible to (i) provide the resistor R1 under a source metal or (ii) design the resistor R1 in any desirable form regardless of the transistor. This allows a reduction in circuit size.

Furthermore, since a sheet resistance of a silicon semiconductor is several tens of thousands of times larger than those of a gate and a source, it is possible to design the resistor R1 in significantly small size.

Furthermore, assume a case where a reset circuit RT is configured such that, when a reset operation is carried out, electric potentials at a gate terminal and a source terminal are high and low, respectively, so that an electric potential difference between the gate terminal and the source terminal is present. In such a case, an on-state resistance of a transistor N1 is small. This allows an operating margin to be secured even if an electrical resistance of a resistor R1 is small. Therefore, a circuit size can be made small by an amount relative to how small the layout size of the resistor R1 is to be made.

Note that the resistor R1 can be provided (i) on a source terminal end of the transistor P2 or (ii) on both of a drain terminal end and a source terminal end of the transistor P2.

Figure 11:
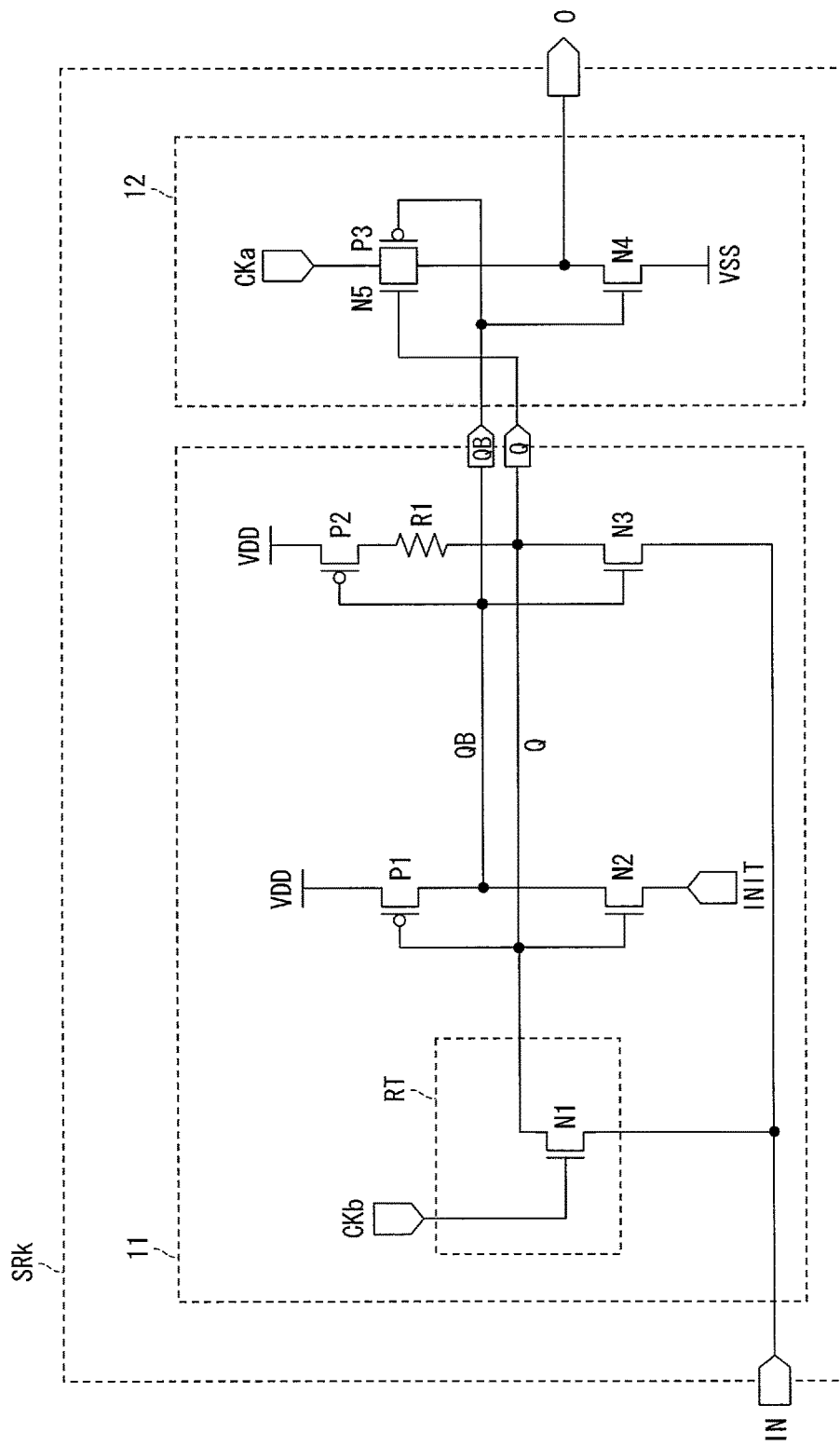
FIG. 11 is a view illustrating a modification of the SR unit circuit of the shift register in accordance with Example 2
Figure 12:
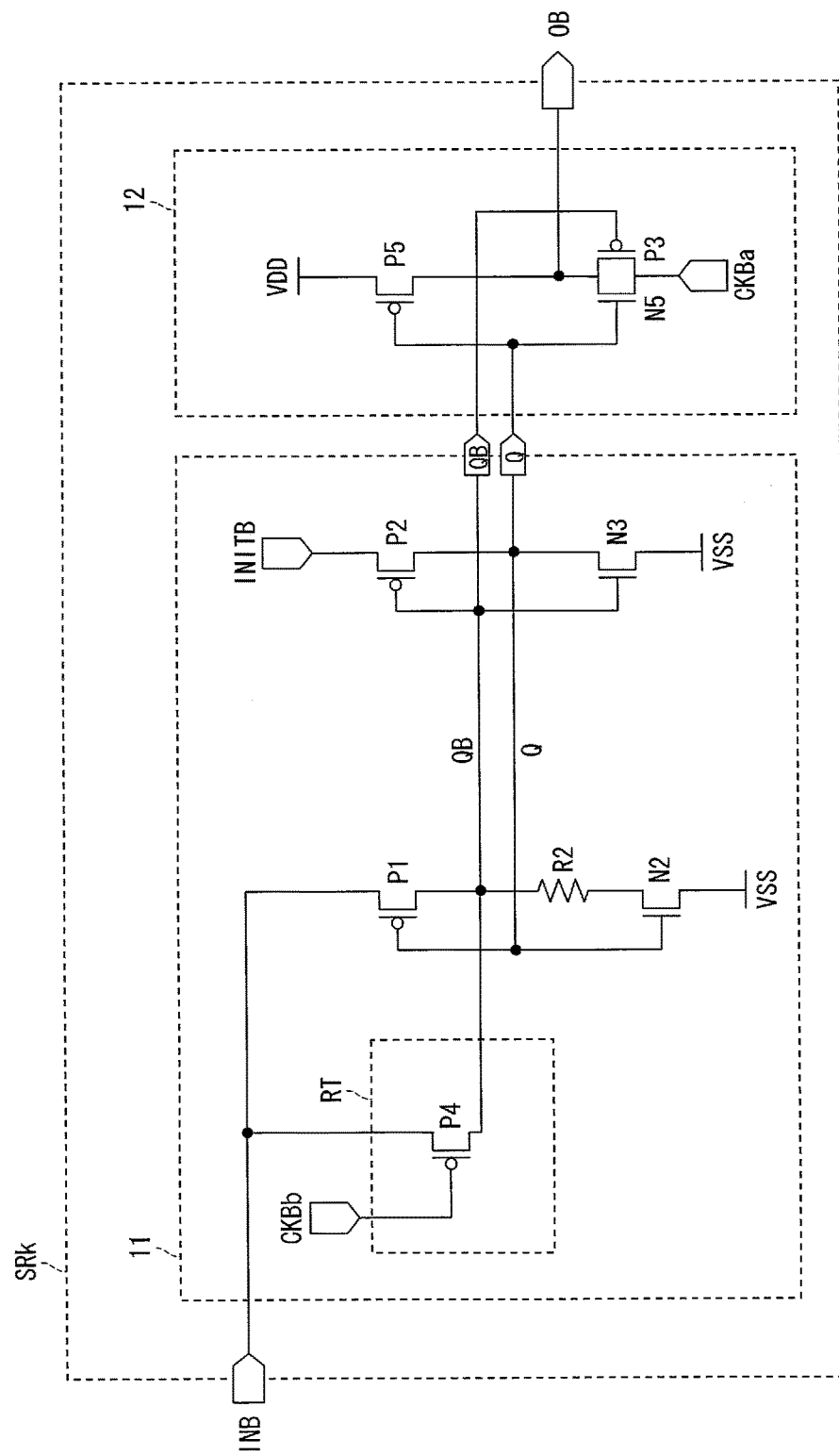
FIG. 12 is a view illustrating another modification of the SR unit circuit of the shift register in accordance with Example 2.

FIGS. 11 and 12 are each a view illustrating a modification of the SR unit circuit of the shift register 20 in accordance with Example 2. An SR unit circuit SRk illustrated in FIG. 11 is configured by providing a resistor R1 in the SR unit circuit SRk illustrated in FIG. 5. An SR unit circuit SRk illustrated in FIG. 12 is configured by providing a resistor R2 in the SR unit circuit SRk illustrated in FIG. 6. According to the SR unit circuit SRk illustrated in FIG. 12, the resistor R2 is provided between a drain terminal of a transistor N2 and a node QB. Note that the resistor R2 can be provided (i) on a source terminal end of the transistor N2 or (ii) on both a drain terminal end and a source terminal end of the transistor N2.

Example 3

Figure 13:
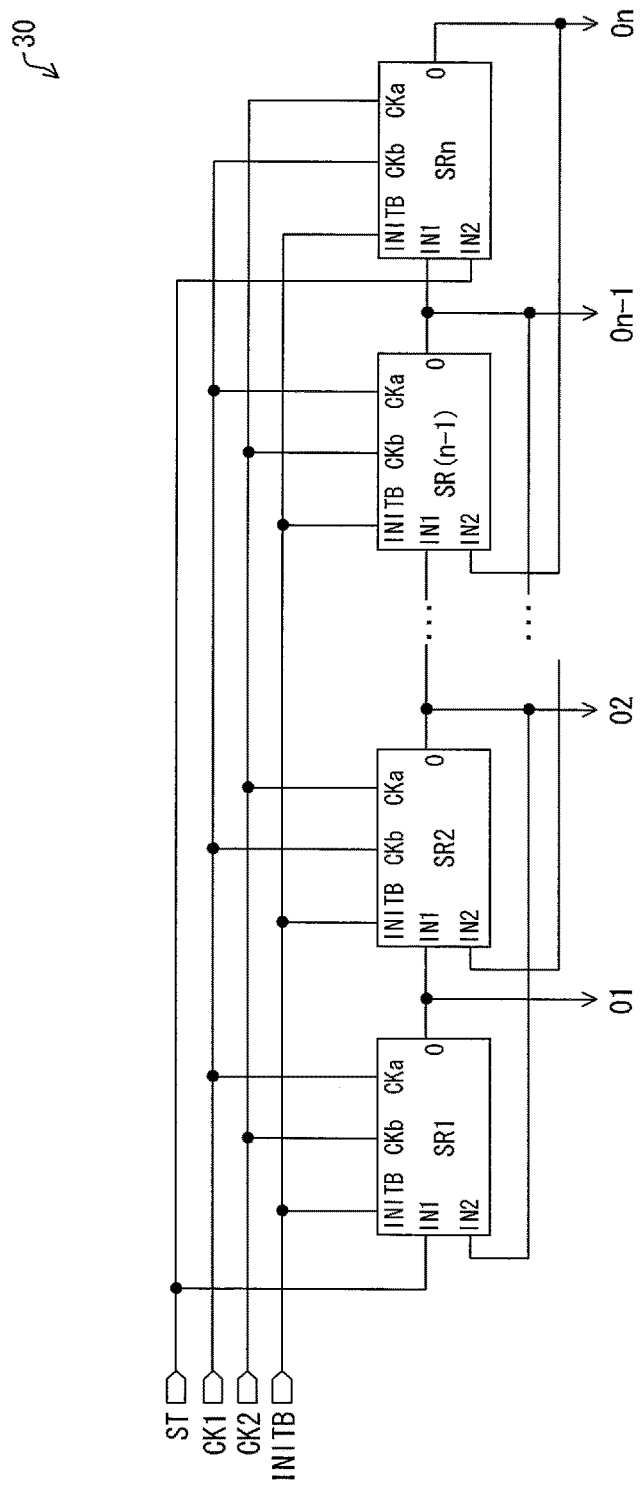
FIG. 13 is a block diagram schematically illustrating a configuration of a shift register in accordance with Example 3.
Figure 14:
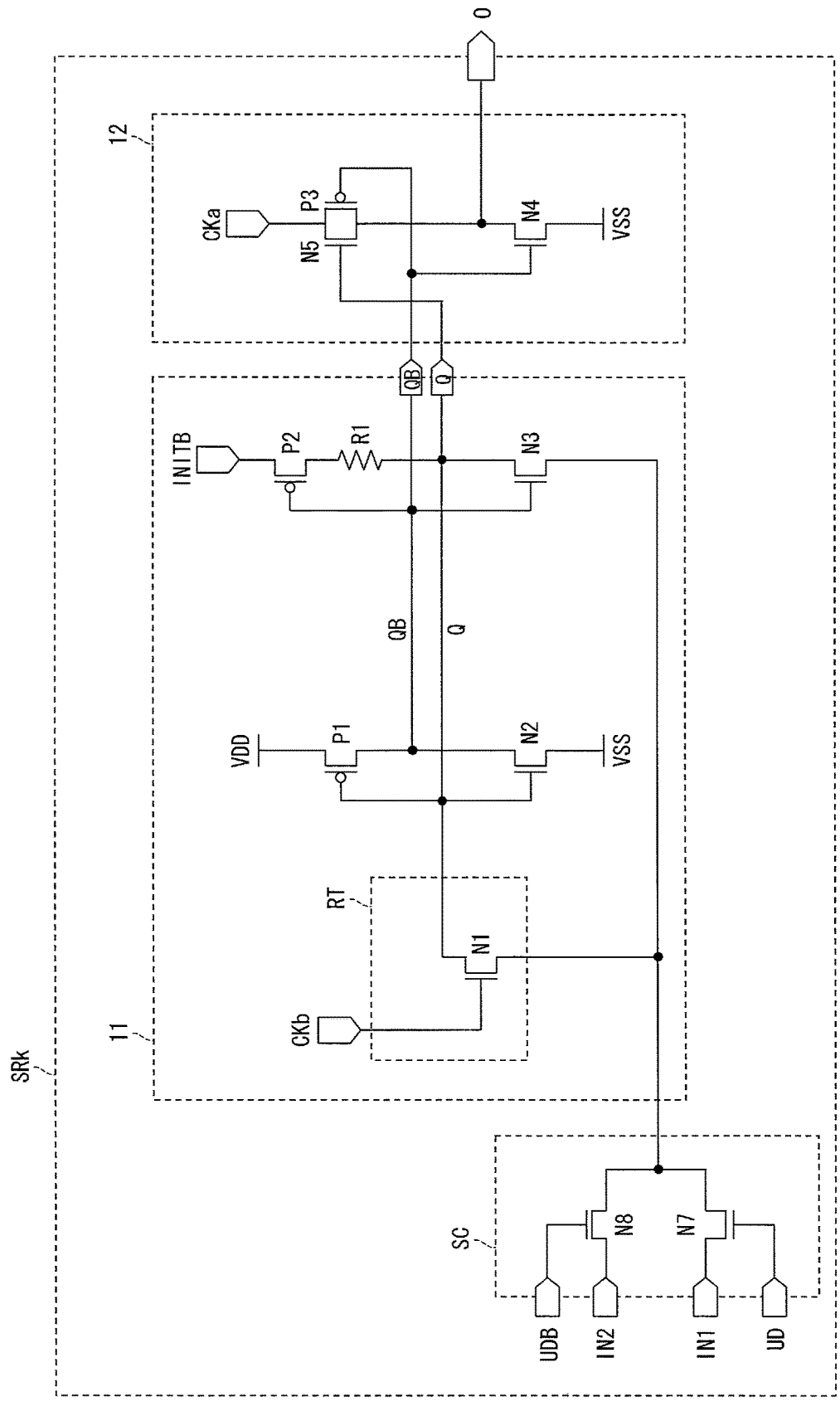
FIG. 14 is a circuit diagram illustrating the SR unit circuit of the shift register in accordance with Example 3.

FIG. 13 is a block diagram schematically illustrating a configuration of a shift register 30 in accordance with Example 3. FIG. 14 is a circuit diagram illustrating an SR unit circuit of the shift register 30. The shift register 30 is configured by providing, in the shift register 10 in accordance with Example 1 illustrated in FIG. 2, a selector circuit SC that changes a scanning direction of the shift register.

The selector circuit SC includes transistors N7 and N8, an IN1 terminal, an IN2 terminal, a UD terminal, and a UDB terminal. A gate terminal, a source terminal, and a drain terminal of the transistor N7 are connected to the UD terminal, the IN1 terminal, and an output terminal of the selector circuit SC, respectively. A gate terminal, a source terminal, and a drain terminal of the transistor N8 are connected to the UDB terminal, the IN2 terminal, and the output terminal of the selector circuit SC, respectively. The output terminal of the selector circuit SC is connected to a source terminal of a transistor N1 and to a source terminal of a transistor N3. The UD terminal receives a switching signal UD. The UDB terminal receives an inversion switching signal UDB (inversion signal of the switching signal UD). A k-th-stage (k is an integer that is equal to or greater than 1 and equal to or less than n) SR unit circuit SRk is configured so that (i) an IN1 terminal is connected to an O terminal of a (k−1)th-stage SR unit circuit SR(k−1) and (ii) an IN2 terminal is connected to an O terminal of a (k+1) th-stage SR unit circuit SR (k+1). Note that an IN1 terminal of a first-stage SR unit circuit SR1 and an IN2 terminal of an n-th-stage SR unit circuit SRn each receive a start pulse ST.

Figure 15:
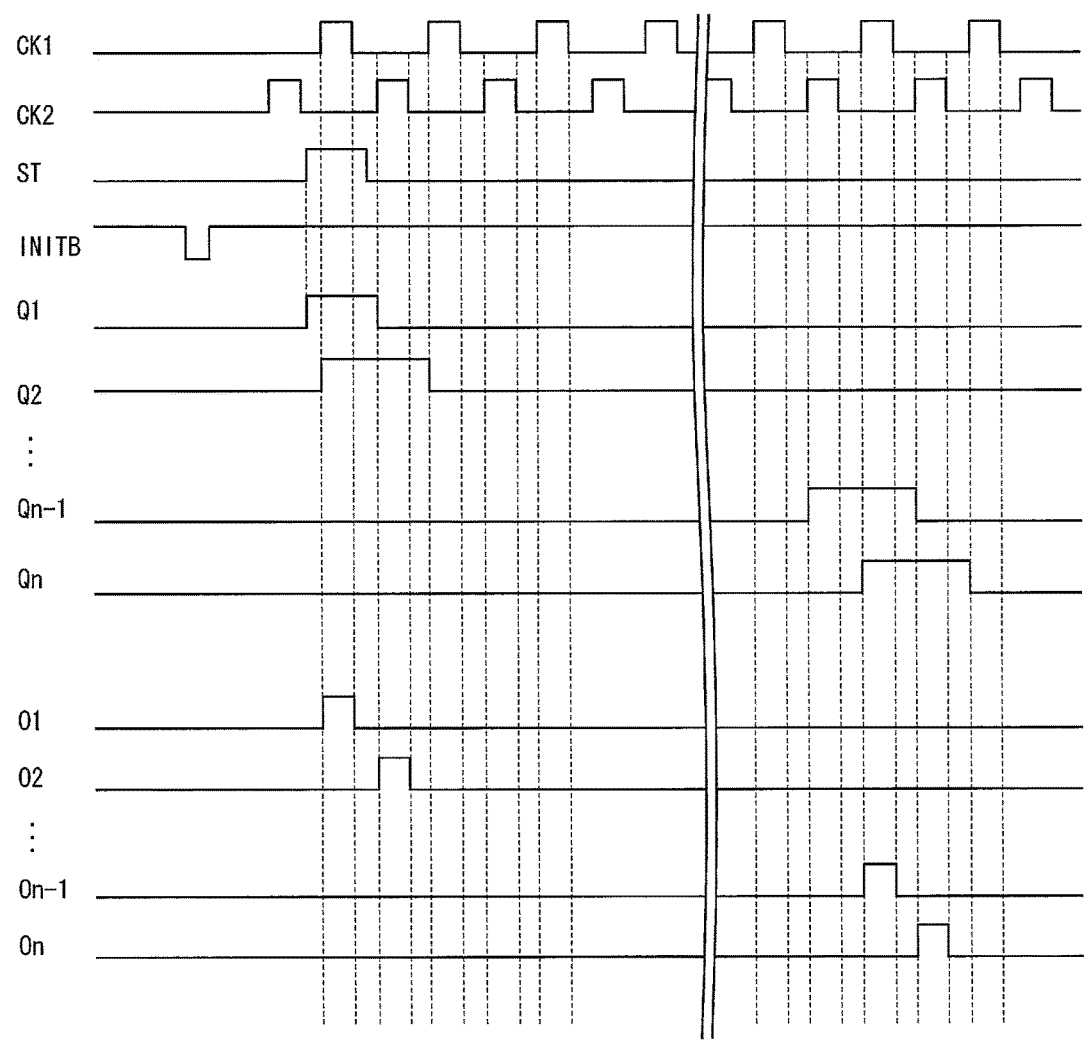
FIG. 15 is a timing chart of the shift register of Example 3 in operation.
Figure 16:
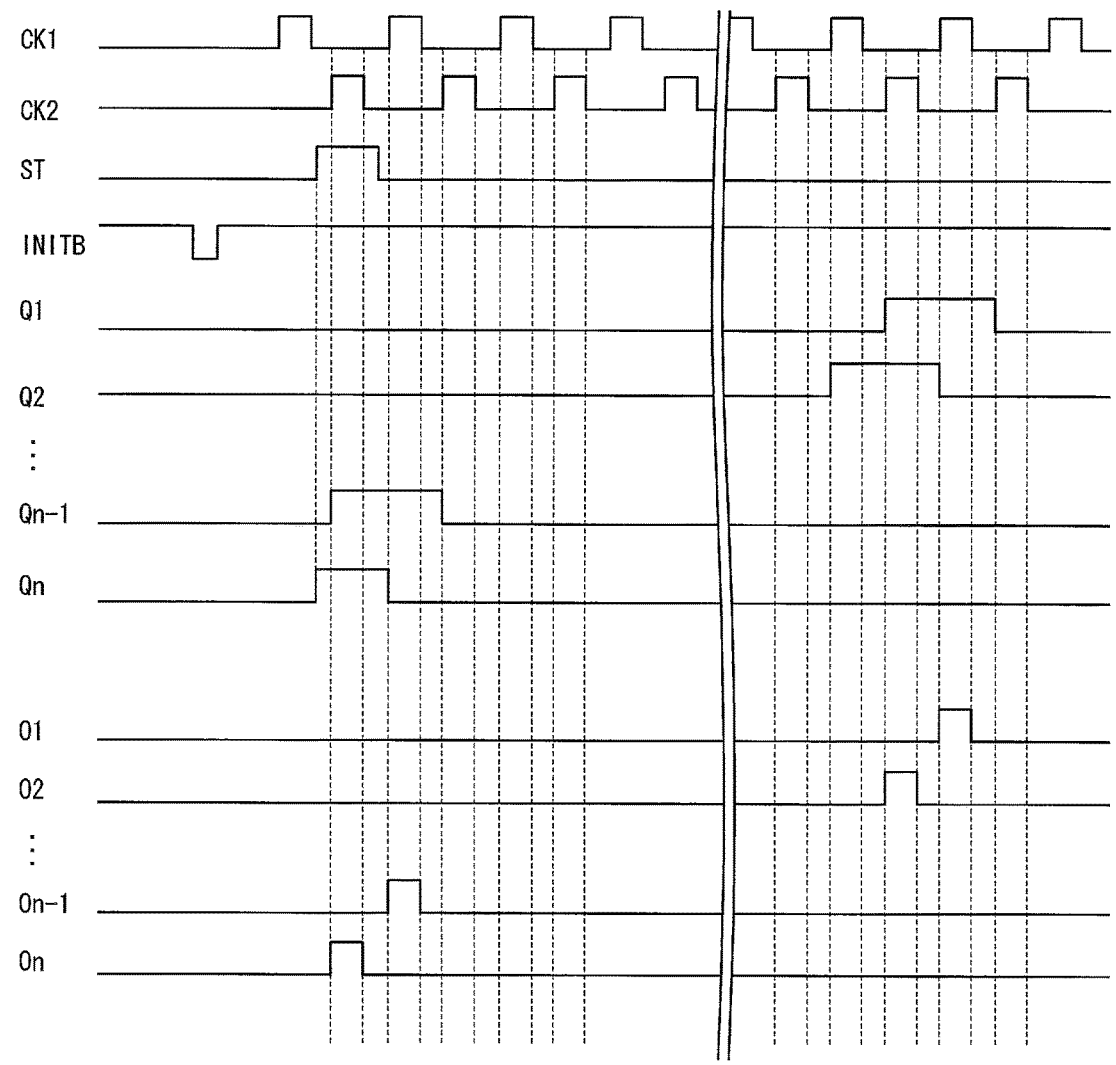
FIG. 16 is a timing chart of the shift register of Example 3 in operation.

FIG. 15 shows a timing chart of a case where an electric potential of the signal UD is high (forward-direction scan). FIG. 16 shows a timing chart of a case where the electric potential of the signal UD is low (reverse-direction scan).

The following is consideration of a reset circuit RT (see FIGS. 2, 5, and 6) of an SR unit circuit SR: Assume a case where a reset operation is carried out, specifically, a case where an electric potential at a node Q or a node QB is to be pulled by turning on a transistor N6 of the reset circuit RT so that a transition is made from a "Q=high, QB=low" state to a "Q=low, QB=high" state. In such a case, as illustrated in FIG. 14, the electric potential at the node Q is determined by (i) an on-state resistance at the transistor N1, (ii) an on-state resistance at the selector circuit SC (which is an on-state resistance at the transistor N7 if the electric potential at the UD terminal is high, and is an on-state resistance at the transistor N8 if the electric potential at the UD terminal is low), and (iii) an on-state resistance at the transistor P2. In a case where the electric potential at the node Q becomes lower than the inversion electric potential of the inverter made up of the transistors P1 and N2, it is possible to interchange the respective electric potentials at the nodes Q and QB by the operation of the latch circuit.

Hence, a selector circuit SC is provided to configure a circuit so that while a reset operation is being carried out, respective electric potentials at a gate terminal and a source terminal of a transistor that is turned on are high and low, respectively, that is, there is an electric potential difference between the gate terminal and the source terminal. This causes on-state resistances of a transistor N1 and of the selector circuit SC to be small. Therefore, it is made easy to pull the electric potential at the node Q to a low level, and it is therefore easy to secure an operating margin.

In addition, in a case where a resistor R1 is provided to further secure the operating margin, the operating margin can be secured even if the electrical resistance of the resistor R1 is small. This allows the layout size of the resistor R1 to be small, and therefore allows the circuit size to be small by an amount relative to how small the layout size of the resistor R1 is to be made small.

Note that a selector circuit SC is configured by transistors having polarities identical to that of a transistor in a reset circuit RT, and that source terminals of the transistors of the selector circuit SC receive signals whose polarities are opposite of those of signals to be supplied to gate terminals.

Figure 17:
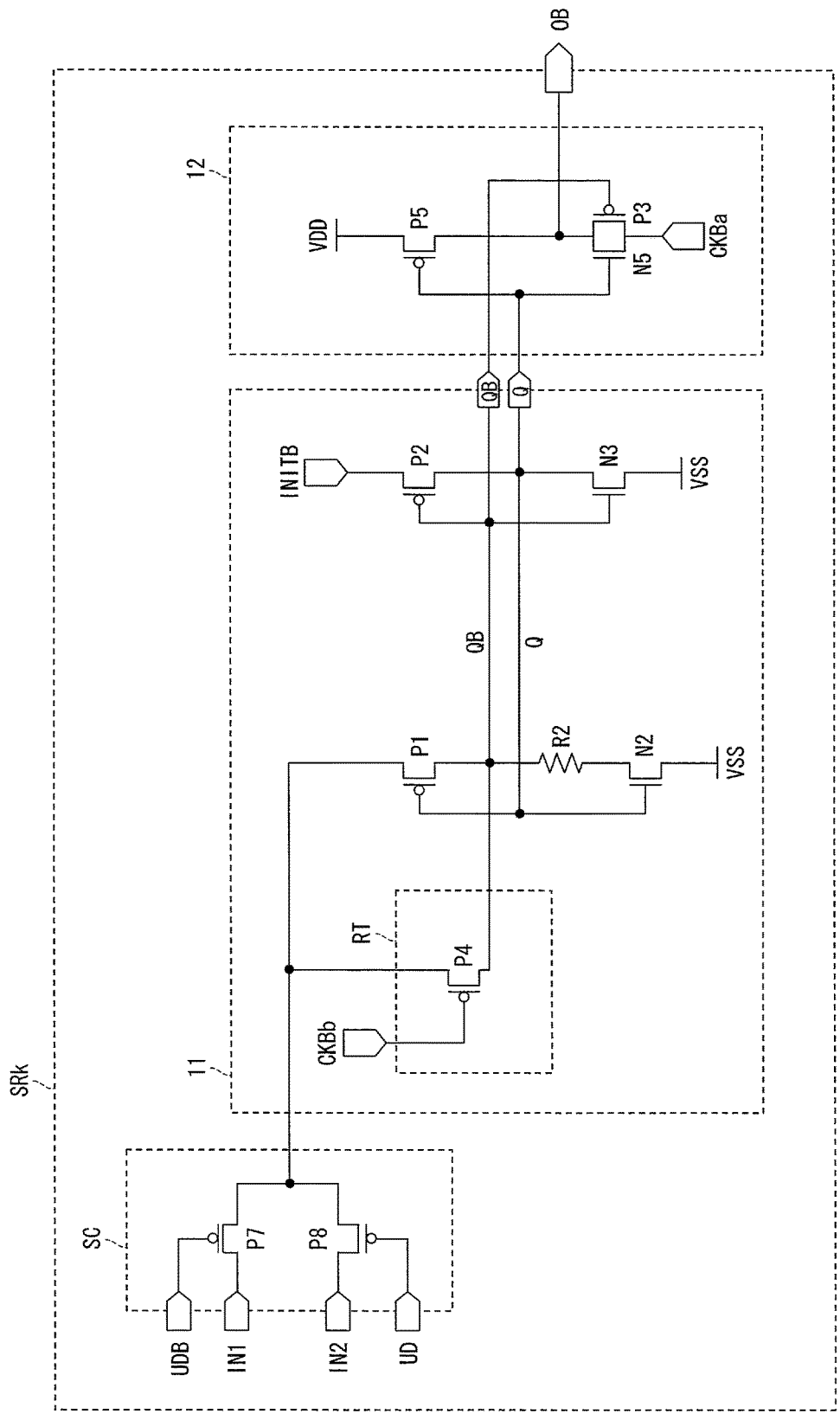
FIG. 17 is a circuit diagram illustrating the SR unit circuit of the shift register in accordance with Example 3.

A selector circuit SC can be provided to each of the shift registers described above. FIG. 17, as an example, illustrates a configuration in which a selector circuit SC is provided to the SR unit circuit SRk illustrated in FIG. 12.

Example 4

Figure 18:
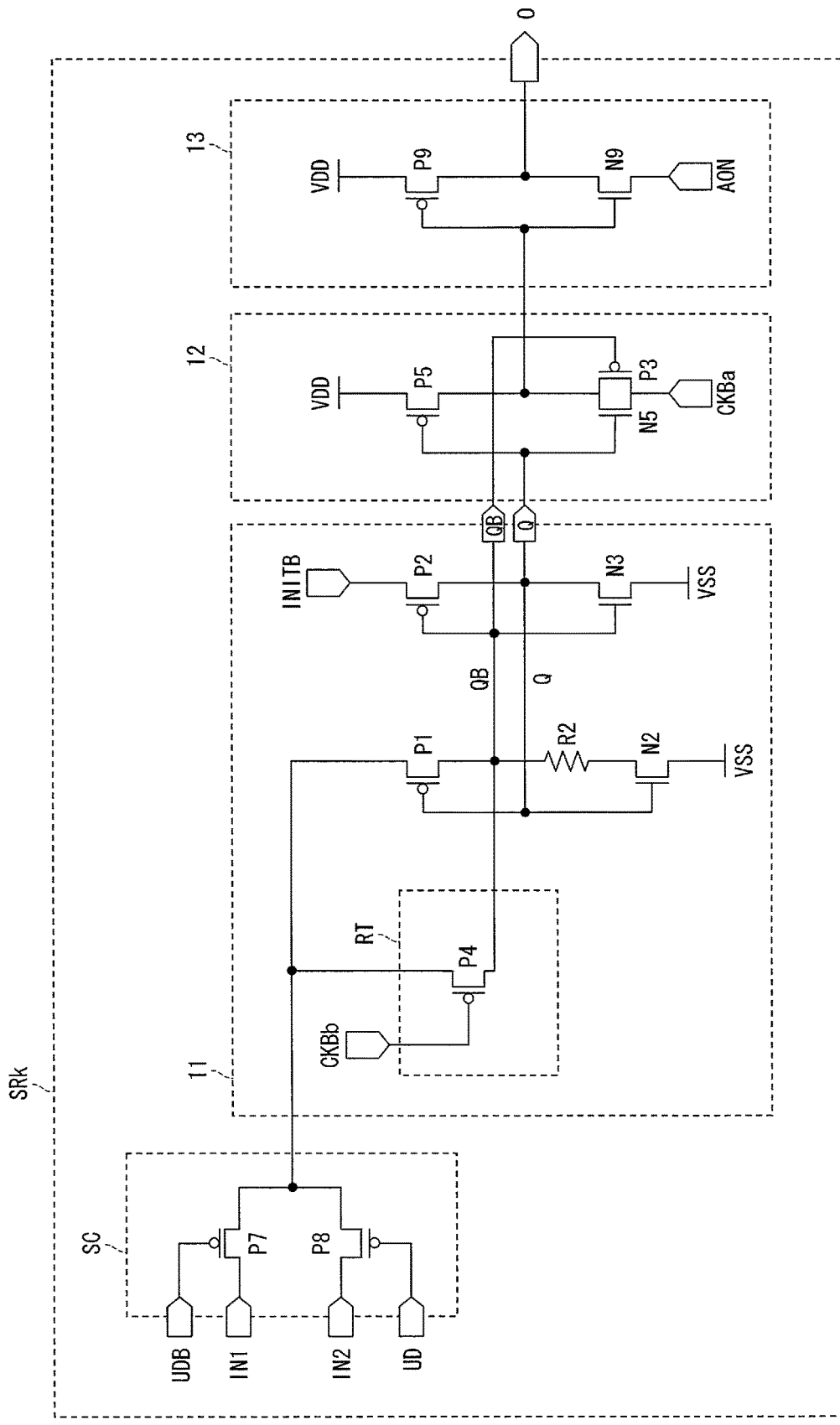
FIG. 18 is a circuit diagram illustrating an SR unit circuit of a shift register in accordance with Example 4.

FIG. 18 is a circuit diagram illustrating an SR unit circuit of a shift register 40 in accordance with Example 4. The SR unit circuit illustrated in FIG. 18 is configured by providing a buffer 13 in the SR unit circuit in accordance with Example 3 illustrated in FIG. 17. The buffer 13 is made up of transistors N9 and P9. The transistor N9 is configured so that (i) a gate terminal is connected to an output terminal of a clock outputting section 12, (ii) a source terminal is connected to an AON terminal (all-on signal input terminal), and (iii) a drain terminal is connected to an Ok terminal (output terminal of the SR unit circuit SRk). The transistor P9 is configured so that (a) a gate terminal is connected to the output terminal of the clock outputting section 12, (b) a source terminal is connected to a VDD (power source), and a drain terminal is connected to the Ok terminal (output terminal of the (SR unit circuit SRk).

Alternatively, the AON terminal can serve as a VSS (power source). In such a case, however, an AOL signal is to have a high electric potential if it is desired that (i) while a normal operation is carried out, the shift register has a low electric potential (VSS electric potential) and (ii) while the normal operation is not carried out, the shift register outputs an active signal(s) (e.g. all of output signals from the shift register are made active during a power-on sequence). This allows an output(s) from the shift register to be active without affecting the logic of the shift register.

With the configuration of Example 4, the SR unit circuit can be used as a drive circuit of a gate driver and/or a source driver of a display device. Note that the buffer 13 can be provided in each of the shift registers described above.

Example 5

Figure 19:
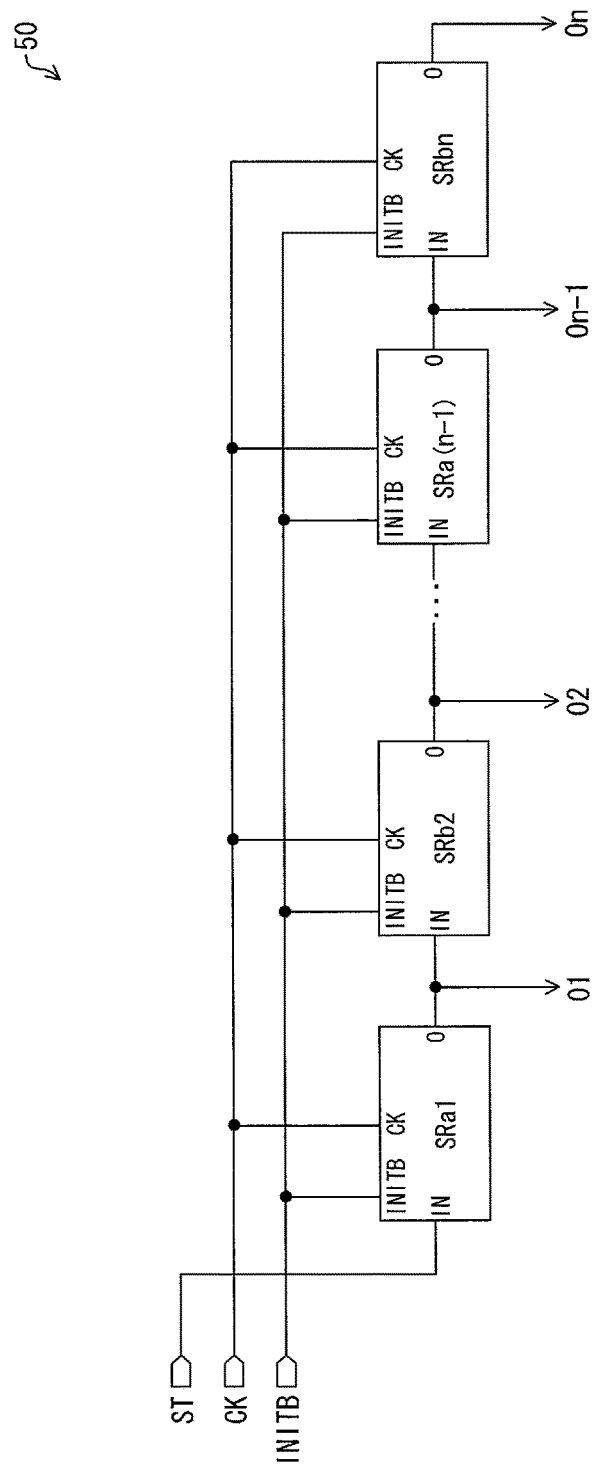
FIG. 19 is a block diagram schematically illustrating a configuration of a shift register in accordance with Example 5.
Figure 20:
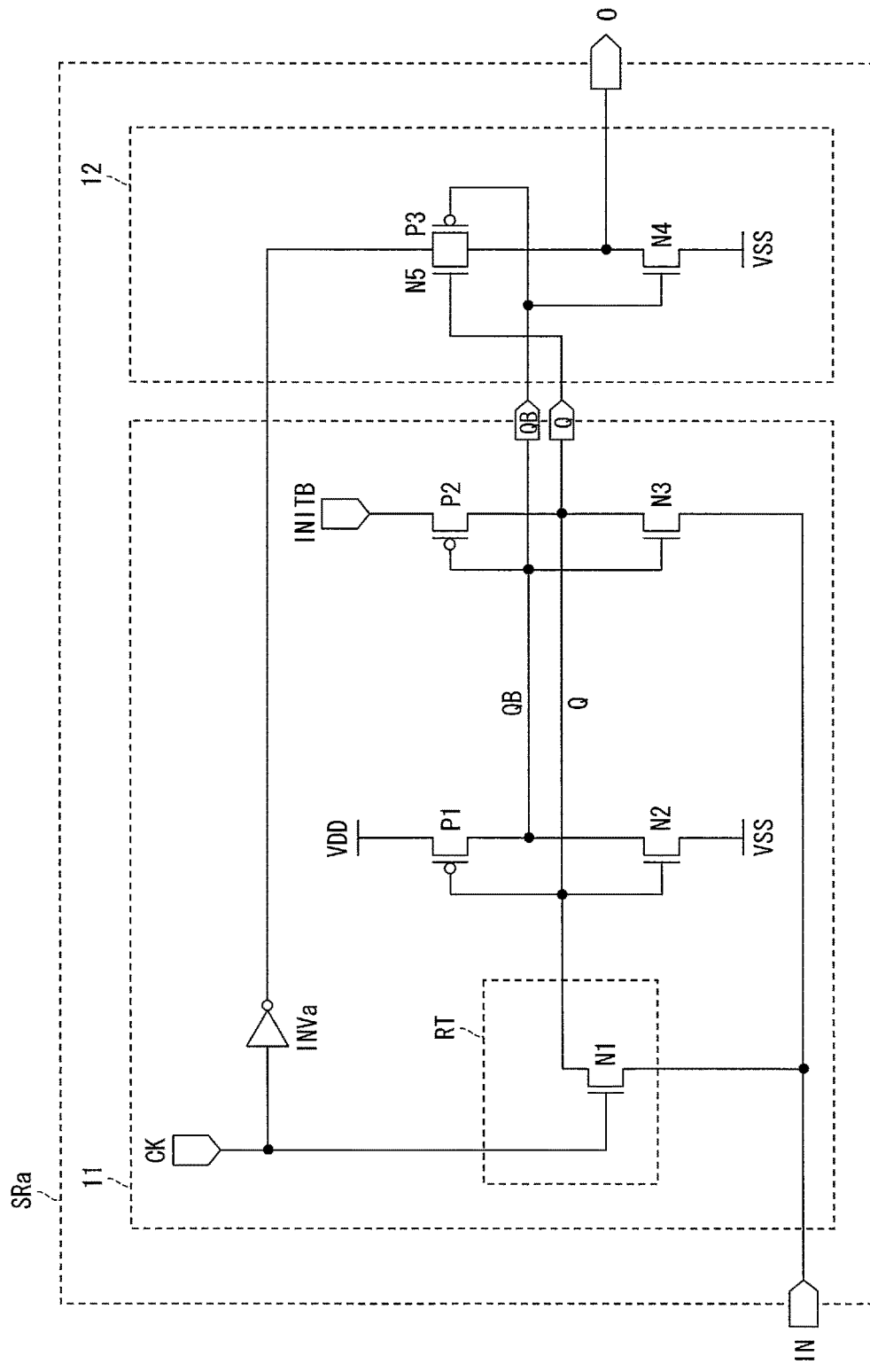
FIG. 20 is a circuit diagram illustrating an SR unit circuit of the shift register in accordance with Example 5.
Figure 21:
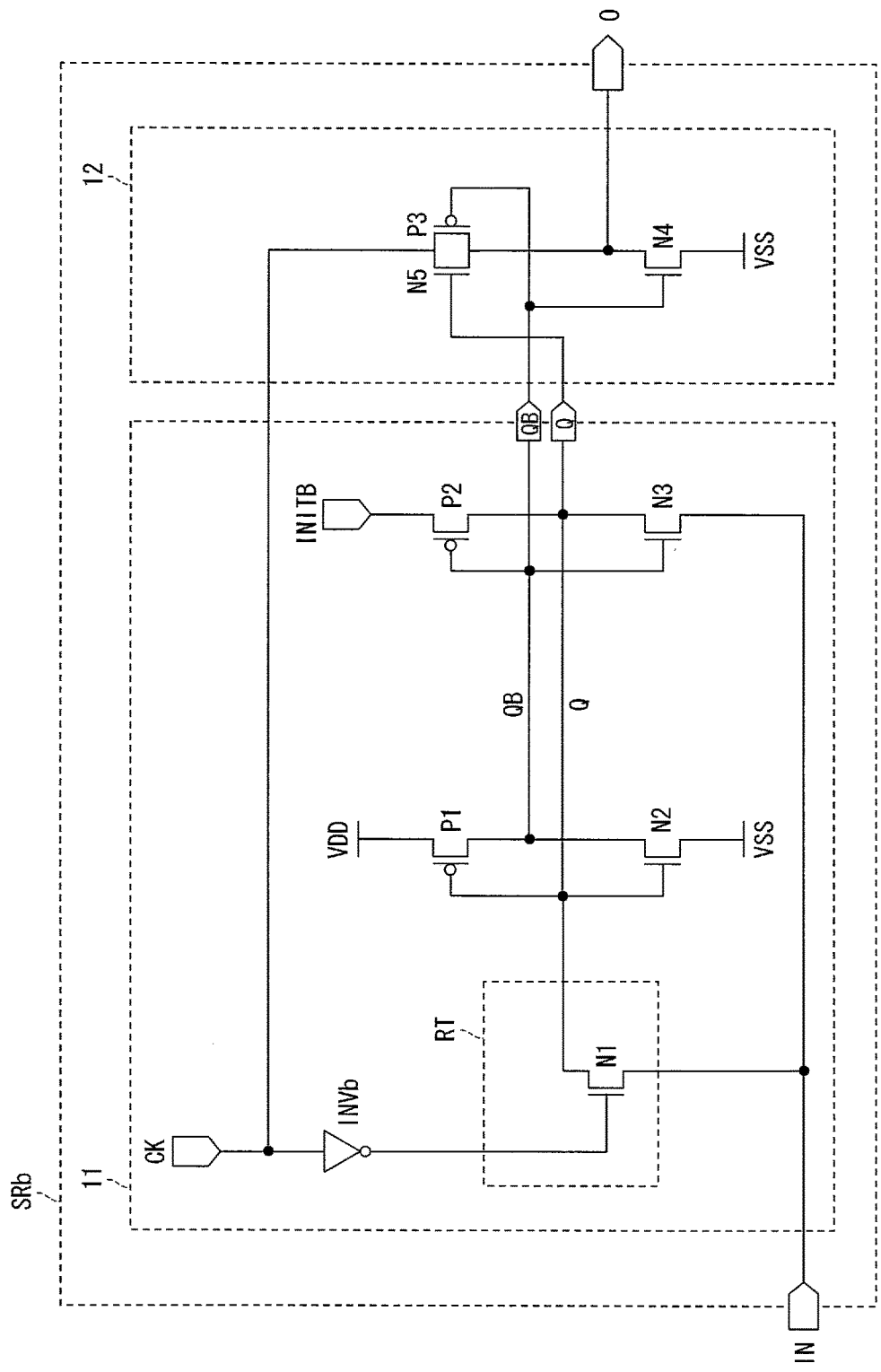
FIG. 21 is a circuit diagram illustrating another SR unit circuit of the shift register in accordance with Example 5.

FIG. 19 is a block diagram schematically illustrating a configuration of a shift register 50 in accordance with Example 5. FIGS. 20 and 21 are each a circuit diagram illustrating an SR unit circuit of the shift register 50. While two phases (double phase) of clock signals CK (CK1, CK2) are supplied to the shift registers described above, one phase (single phase) of clock signal CK is supplied to the shift register 50 of Example 5. Specifically, the shift register 50 receives one-phase clock signal CK via a single main clock wire.

As illustrated in FIG. 19, the shift register 50 is configured by alternately providing first SR unit circuits SRa and second SR unit circuits SRb and connecting the first SR unit circuits SRa and the second SR unit circuits SRb.

According to each of the first SR unit circuits SRa, as illustrated in FIG. 20, an inverter INVa is provided between a CK terminal and an input terminal of a clock outputting section 12. The inverter INVa generates an inversion signal (inversion clock signal CKB) of a clock signal CK which is supplied to the CK terminal. The clock signal CK is supplied to a gate terminal of a transistor N1 whereas the inversion clock signal CKB is supplied to the clock outputting section 12.

According to each of the second SR unit circuits SRb, as illustrated in FIG. 21, an inverter INVb is provided between a CK terminal and a gate terminal of a transistor N1. The inverter INVb generates an inversion signal (inversion clock signal CKB) of a clock signal CK which is supplied to the CK terminal. The inversion clock signal CKB is supplied to the gate terminal of the transistor N1 whereas the clock signal CK is supplied to a clock outputting section 12.

The configurations of the first SR unit circuits SRa and the second SR unit circuits SRb are identical to those of the SR unit circuits SR in accordance with Example 1 except for (i) the phase of clock signals to be supplied and (ii) the presence of the inverters INV. As illustrated in FIG. 19, the CK terminals of the first SR unit circuits SRa and the second SR unit circuits SRb are connected to the common (single) main clock wire.

Figure 22:
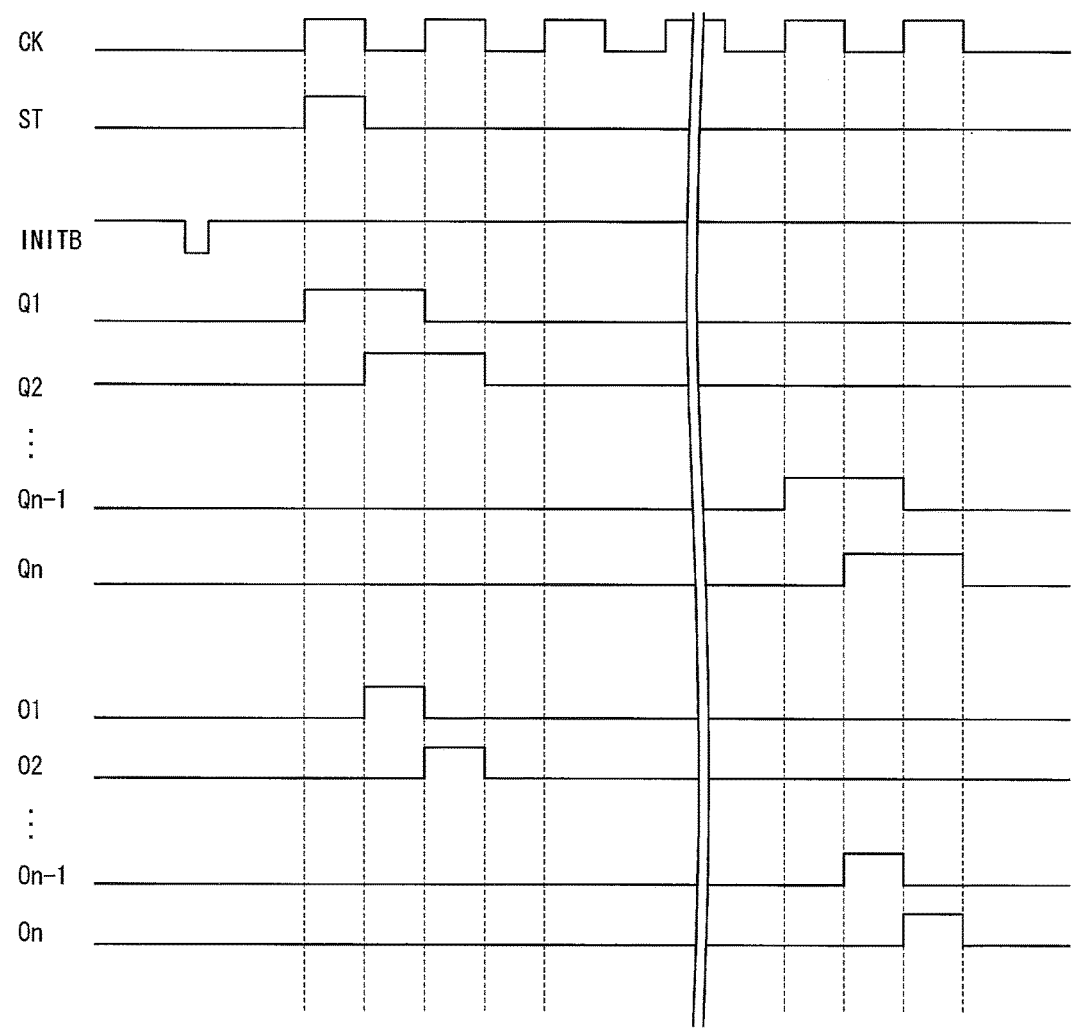
FIG. 22 is a timing chart of the shift register of Example 5 in operation.

FIG. 22 is a timing chart of the shift register 50 in operation.

In a case where a start pulse ST is supplied to a first-stage first SR unit circuit SRa1, the first SR unit circuit SRa1 becomes active, so that an electric potential at a node Q1 becomes high. Since an electric potential of a clock signal CK is high immediately after the start pulse ST is supplied, an electric potential of an inversion clock signal CKB is low, so that an electric potential of an output signal O1 is low.

In so doing, the electric potential of the clock signal CK supplied to a gate terminal of a transistor N1 is high, so that the transistor N1 is turned on. However, since an electric potential of the start pulse ST is high, the electric potential at the node Q1 remains high. In a case where the electric potential of the clock signal CK changes from a high level to a low level, an electric potential of the inversion clock signal CKB changes from a low level to a high level. This causes the electric potential of the output signal O1 to be high.

Next, in a case where the electric potential of the clock signal CK changes from a low level to a high level, the electric potential of the inversion clock signal CKB changes from a high level to a low level. This causes the electric potential of the output signal O1 to be low. Meanwhile, the clock signal CK having a high electric potential is supplied to the gate terminal of the transistor N1. This causes the transistor N1 to be turned on.

In so doing, the electric potential of the start pulse ST is low. This causes the electric potential at the node Q1 to change to a low level and causes an electric potential at a node QB1 to change to a high level, so that the first SR unit circuit SRa1 becomes inactive.

When the electric potential of the output signal O1 becomes high, an electric potential at an IN terminal of a second-stage second SR unit circuit SRb2 becomes high, so that the second SR unit circuit SRb2 becomes active (electric potentials at a node Q2 and at a node QB2 being high and low, respectively). In so doing, since the electric potential of the clock signal CK is low, the inversion clock signal CKB having a high electric potential is supplied to a gate terminal of a transistor N1, so that the gate terminal become active. However, since the electric potential at the IN terminal is high, an electric potential at a node Q2 remains high. In addition, since the electric potential of the clock signal CK is low, an electric potential of an output signal O2 is low. In a case where the electric potential of the clock signal CK changes from a low level to a high level, the electric potential of the output signal O2 becomes high as well. In a case where the electric potential of the clock signal CK changes from a high level to a low level, (i) the electric potential of the output signal O2 changes from a high level to a low level and (ii) the electric potential of the inversion clock signal CKB becomes high. This causes the transistor N1 to be turned on.

In so doing, the electric potential at the IN terminal is low. This causes the electric potential at the node Q to change to a low level and causes the electric potential at the node QB to change to a high level, so that the second SR unit circuit SRb2 becomes inactive.

The shift register 50 is capable of sequentially outputting output signals O1 through On by repeating the above operation.

(Modification of Example 5)

Figure 23:
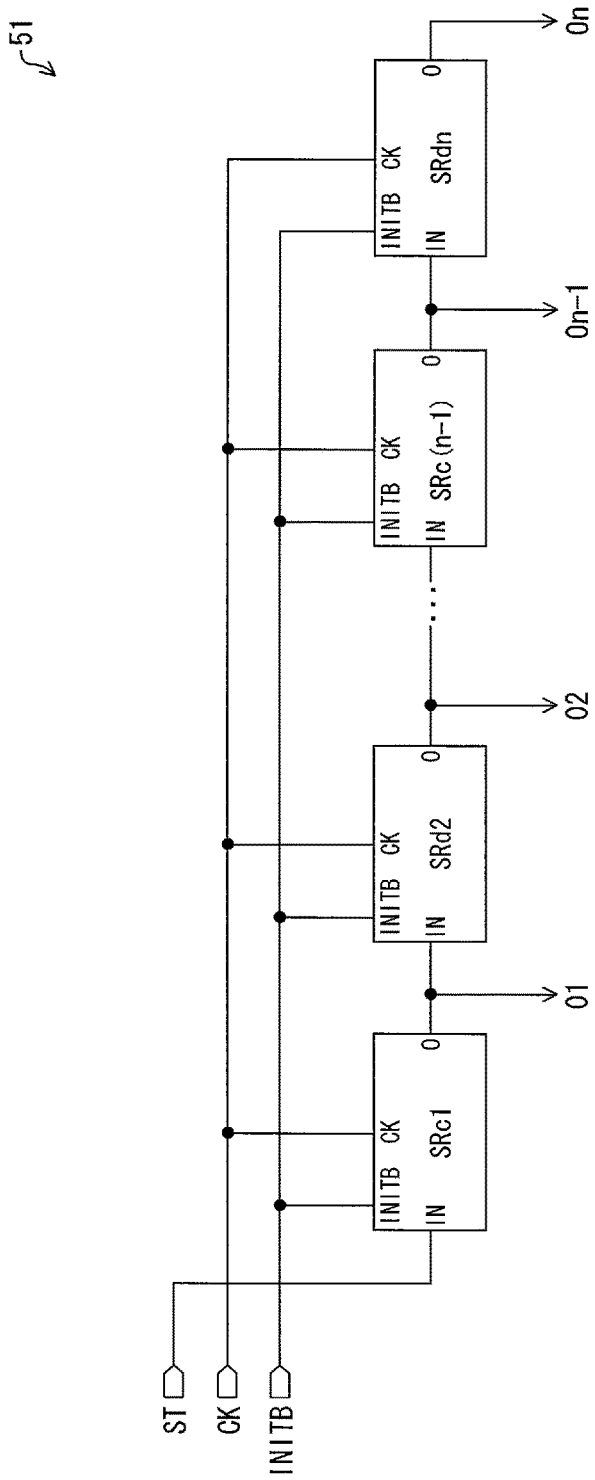
FIG. 23 is a block diagram illustrating a modification of the shift register in accordance with Example 5.
Figure 24:
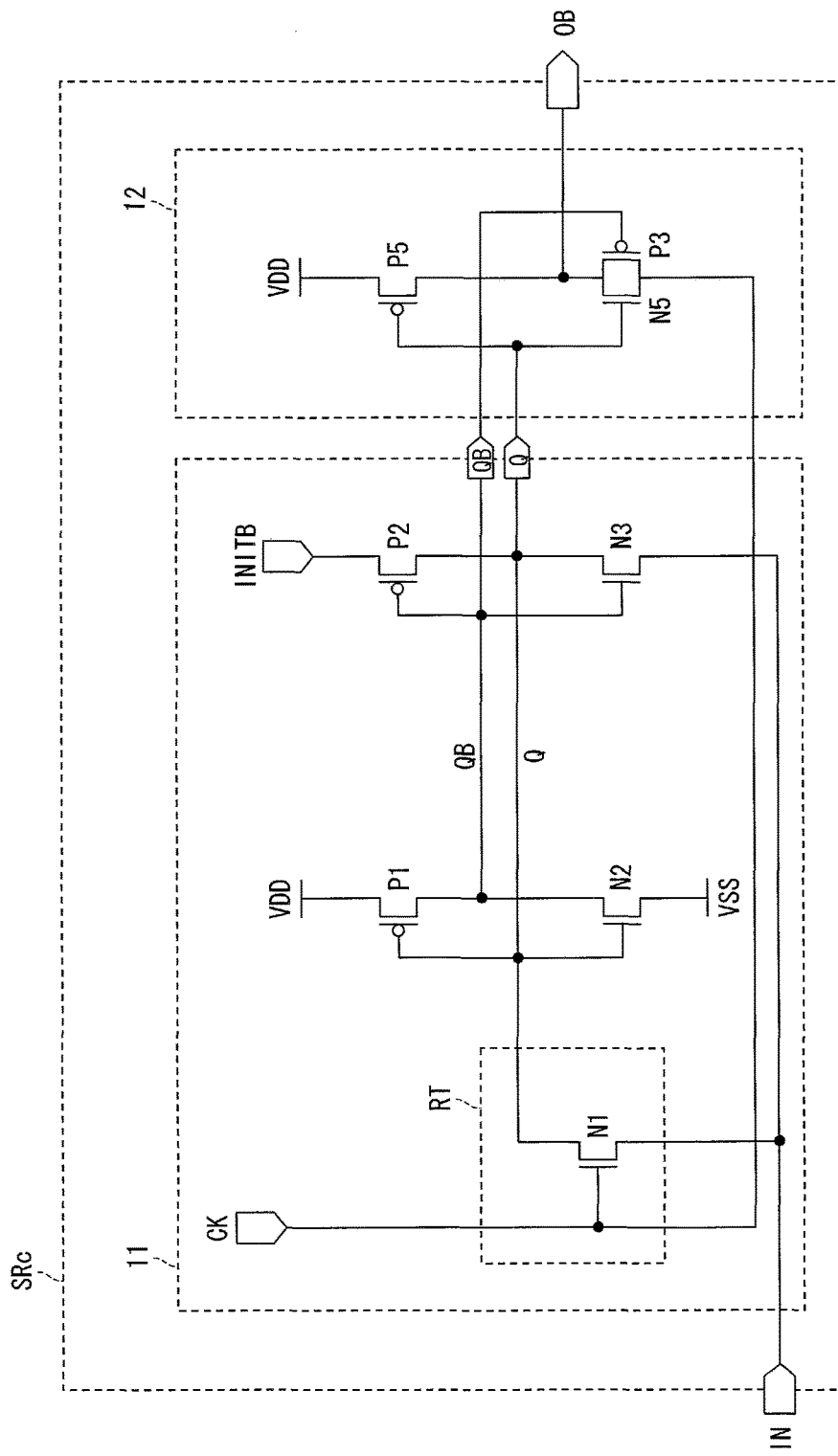
FIG. 24 is a circuit diagram illustrating a modification of the SR unit circuit of the shift register in accordance with Example 5.
Figure 25:
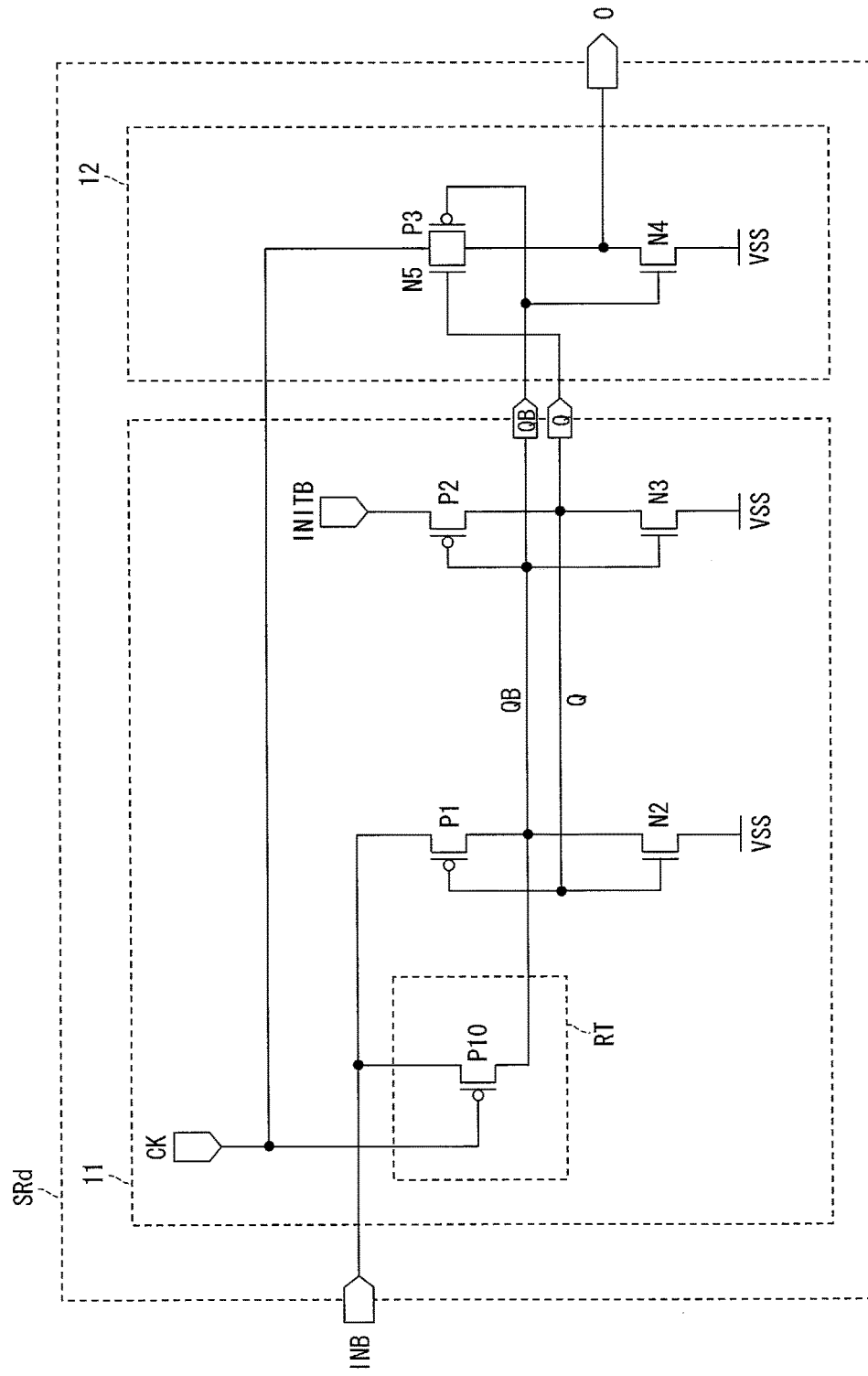
FIG. 25 is a circuit diagram illustrating another modification of the SR unit circuit of the shift register in accordance with Example 5.

FIG. 23 is a block diagram illustrating a modification (shift register 51) of the shift register 50 in accordance with Example 5. FIGS. 24 and 25 are each a circuit diagram illustrating an SR unit circuit of the shift register 51.

As illustrated in FIG. 23, the shift register 51 is configured by alternately providing first SR unit circuits SRc and second SR unit circuits SRd and connecting the first SR unit circuits SRc the second SR unit circuits SRd.

According to each of the first SR unit circuits SRc, a gate terminal of a transistor N1 and respective source terminals of transistors N5 and P3 are connected to a CK terminal (see FIG. 24). A transistor P5, by which a clock outputting section 12 is configured, has a gate terminal, a source terminal, and a drain terminal which are connected to a node Q, a VDD, and an OB terminal, respectively.

According to each of the second SR unit circuits SRd, as illustrated in FIG. 25, (i) respective source terminals of transistors P1 and P10 are connected to an INB terminal (which is connected to an OB terminal of a previous stage) and (ii) a gate terminal of the transistor P10 and respective source terminals of transistors N5 and P3 are connected to a CK terminal.

The rest of the configurations of the first SR unit circuits SRc and the second SR unit circuits SRd is identical to the configuration of the SR unit circuit SR in accordance with Example 1. Note that, as illustrated in FIG. 23, the CK terminals of the first SR unit circuits SRc and the second SR unit circuits SRd are connected to a common (single) main clock wire.

Figure 26:
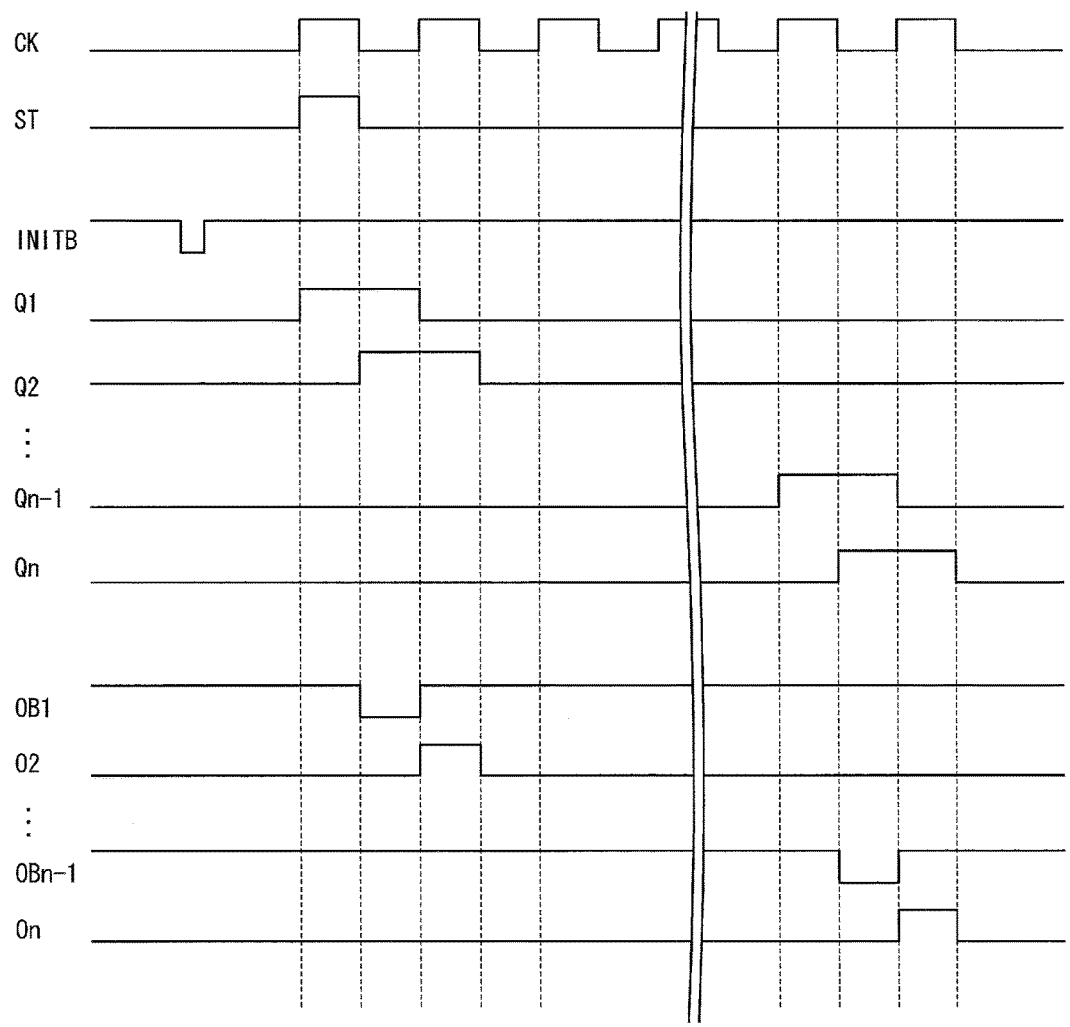
FIG. 26 is a timing chart of the shift register of FIG. 23 in operation.

FIG. 26 is a timing chart of the shift register 51 in operation.

In a case where a start pulse ST is supplied to a first-stage first SR unit circuit SRc1, the first SR unit circuit SRc1 becomes active. This causes an electric potential at a node Q1 to become high. Since an electric potential of a clock signal CK is high immediately after the start pulse ST is supplied, a transistor N1 is turned on. However, since an electric potential at an IN terminal (start pulse ST) is high, an electric potential at a node Q remains high. In a case where the electric potential of the clock signal CK changes from a high level to a low level, an electric potential of an output signal OB1 becomes low.

Next, in a case where the electric potential of the clock signal CK changes from a low level to a high level, the clock signal CK having a high electric potential is supplied to a gate terminal of the transistor N1. This causes the transistor N1 to be turned on. In so doing, the electric potential at the IN terminal (start pulse ST) is low. This causes the present embodiment at the node Q1 to change to a low level and causes an electric potential at a node QB1 to change to a high level, so that the first SR unit circuit SRc1 becomes inactive.

When the electric potential of the output signal OB1 becomes low, an electric potential at an INB terminal of a second-stage second SR unit circuit SRd2 becomes low, so that the second SR unit circuit SRd2 becomes active (electric potentials at a node Q2 and at a node QB2 being high and low, respectively). In so doing, since the electric potential of the clock signal CK is low, a gate terminal of a transistor P10, to which the clock signal CK is supplied, becomes turned on. However, since the electric potential at the INB terminal is low, an electric potential at a node QB2 remains low. In addition, since the electric potential of the clock signal CK is low, an electric potential of an output signal O2 is low. In a case where the electric potential of the clock signal CK changes from a low level to a high level, the electric potential of the output signal O2 becomes high as well. In a case where the electric potential of the clock signal CK changes from a high level to a low level, (i) the electric potential of the output signal O2 changes from a high level to a low level and (ii) the transistor P10 becomes turned on. In so doing, the electric potential at the INB terminal is high. This causes the electric potential at the node QB2 to change to a high level and causes an electric potential at a node Q2 to change to a low level, so that the second SR unit circuits SRd2 becomes inactive.

The shift register 51 is capable of sequentially outputting output signals O1 through On by repeating the above operation.

Example 6

Figure 27:
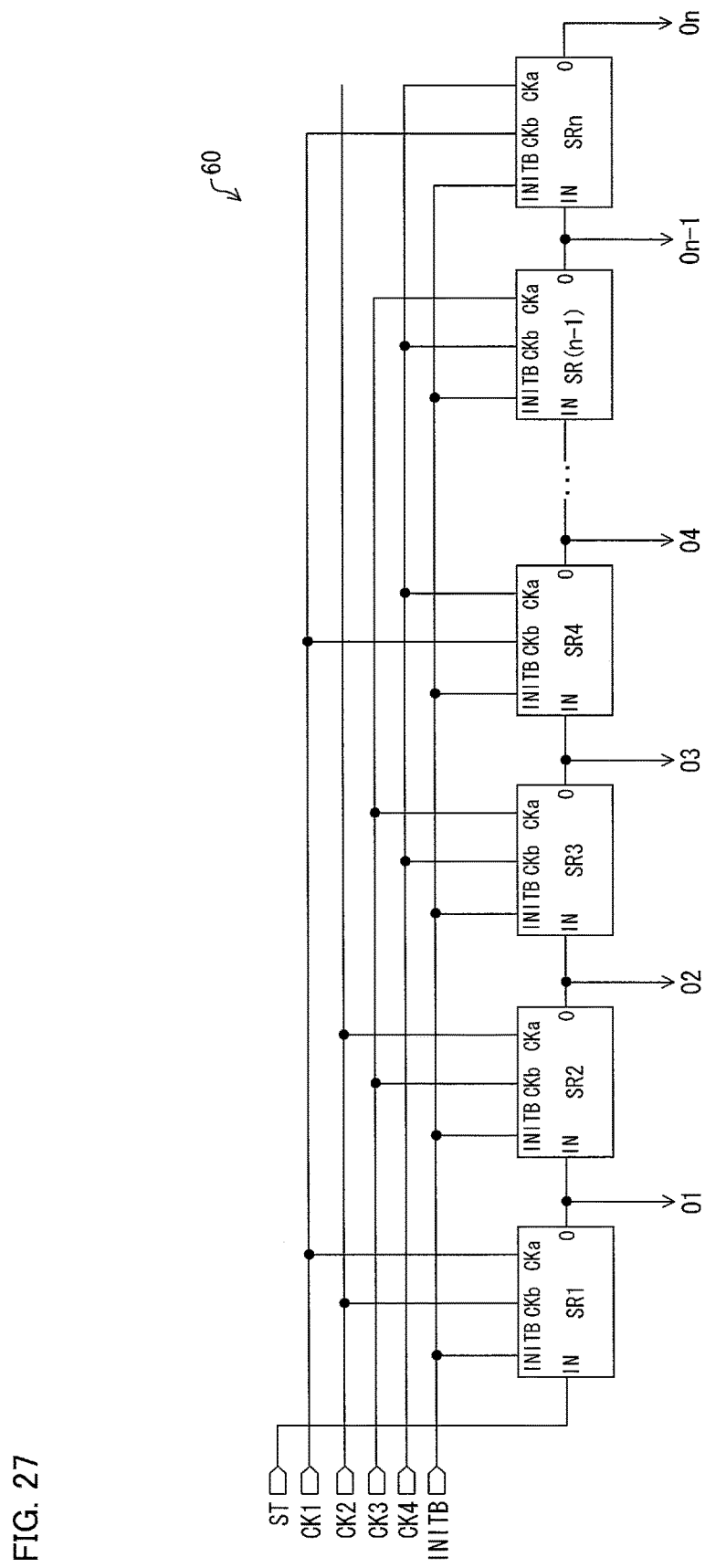
FIG. 27 is a block diagram schematically illustrating a configuration of a shift register in accordance with Example 6.

FIG. 27 is a block diagram schematically illustrating a configuration of a shift register 60 in accordance with Example 6. SR unit circuits, by which the shift register 60 is configured, are identical in configuration to the SR unit circuit illustrated in FIG. 2. According to the shift register 60, there are four phases of clock signals CK (CK1 through CK4). Specifically, the four phases of clock signals CK1 through CK4 are supplied to the shift register 60 via four main clock wires.

According to a first-stage SR unit circuit SR1, a clock signal CK1 and a clock signal CK2 are supplied to a CKa terminal and a CKb terminal, respectively. According to a second-stage SR unit circuit SR2, the clock signal CK2 and a clock signal CK3 are supplied to a CKa terminal and a CKb terminal, respectively. According to a third-stage SR unit circuit SR3, the clock signal CK3 and a clock signal CK4 are supplied to a CKa terminal and a CKb terminal, respectively. According to a fourth-stage SR unit circuit SR4, the clock signal CK4 and the clock signal CK1 are supplied to a CKa terminal and a CKb terminal, respectively. According to a fifth-stage SR unit circuit SR5, as is the case of the first-stage SR unit circuit SR1, the clock signal CK1 and the clock signal CK2 are supplied to a CKa terminal and a CKb terminal, respectively. Such connections of the SR unit circuit SR1 through SR4 in relation to one another are thus continually repeated.

Figure 28:
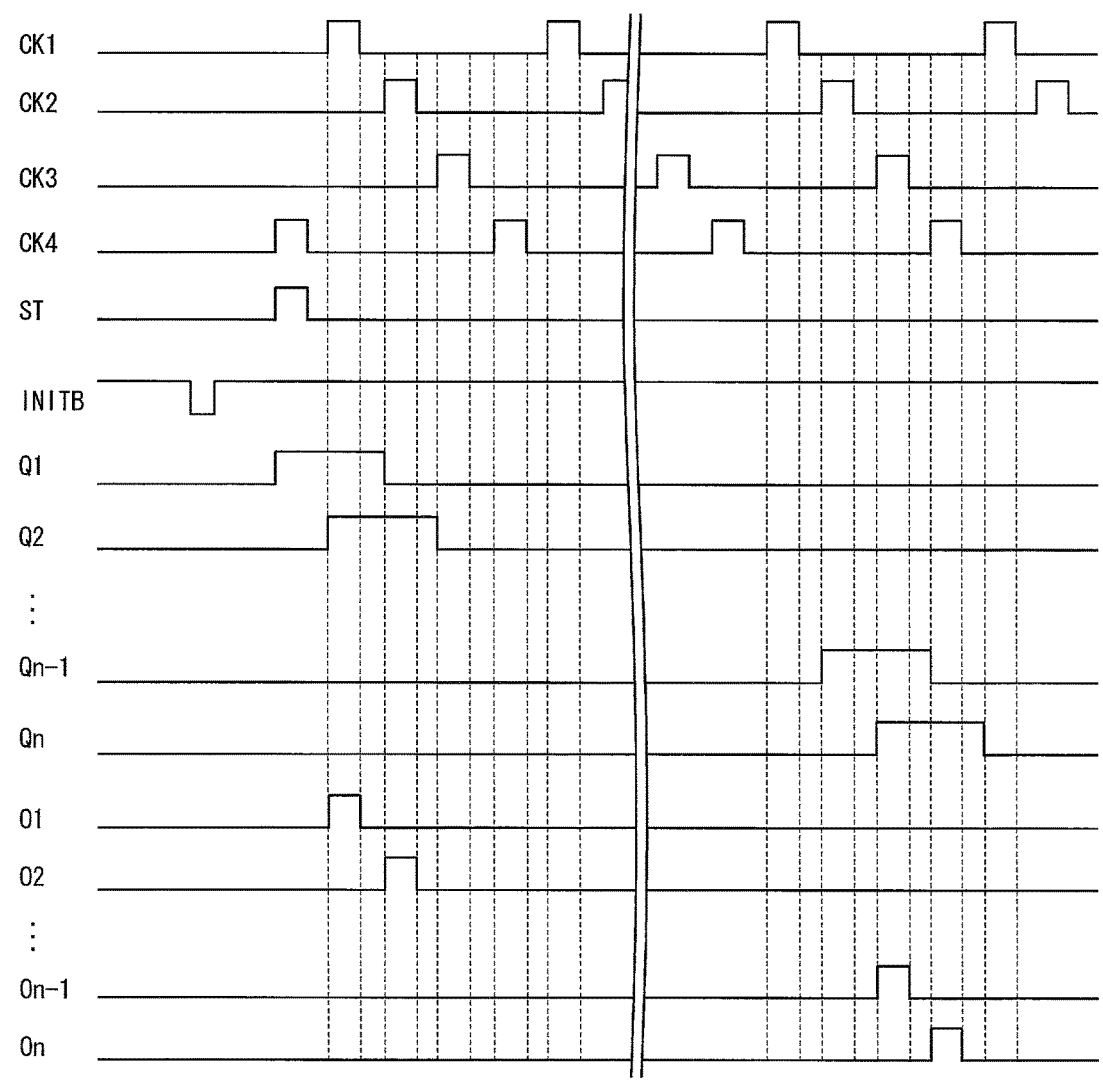
FIG. 28 is a timing chart illustrating the shift register of Example 6 in operation.

FIG. 28 is a timing chart of the shift register 60 in operation. As illustrated in FIG. 28, the four phases of clock signals CK1 through CK4 are shifted from one another so that respective rising edges (in a case where a circuit configuration is to be high-active) of the clock signals CK1 through CK4 do not overlap one another. Specifically, the rising edge of the clock signal CK2 is behind that of the clock signal CK1 by ¼ of a clock period. The rising edge of the clock signal CK3 is behind that of the clock signal CK1 by 2/4 of the clock period. The rising edge of the clock signal CK4 is behind that of the clock signal CK1 by ¾ of the clock period.

Although the above description employed the example in which there are four phases of clock signals, the present invention is not limited to such an example. In fact, there can be three phases of clock signals. In other words, the shift register of the present embodiment can receive m-phases (m is an integer that is 1 or greater) of clock signals.

The number of transistors to be connected to each main clock wire can be reduced by increasing the total number of main clock wires as in Example 6. This allows a reduction in the load of the main clock wires, and therefore allows a high-speed operation of the shift register.

(Modification of Example 6)

Figure 29:
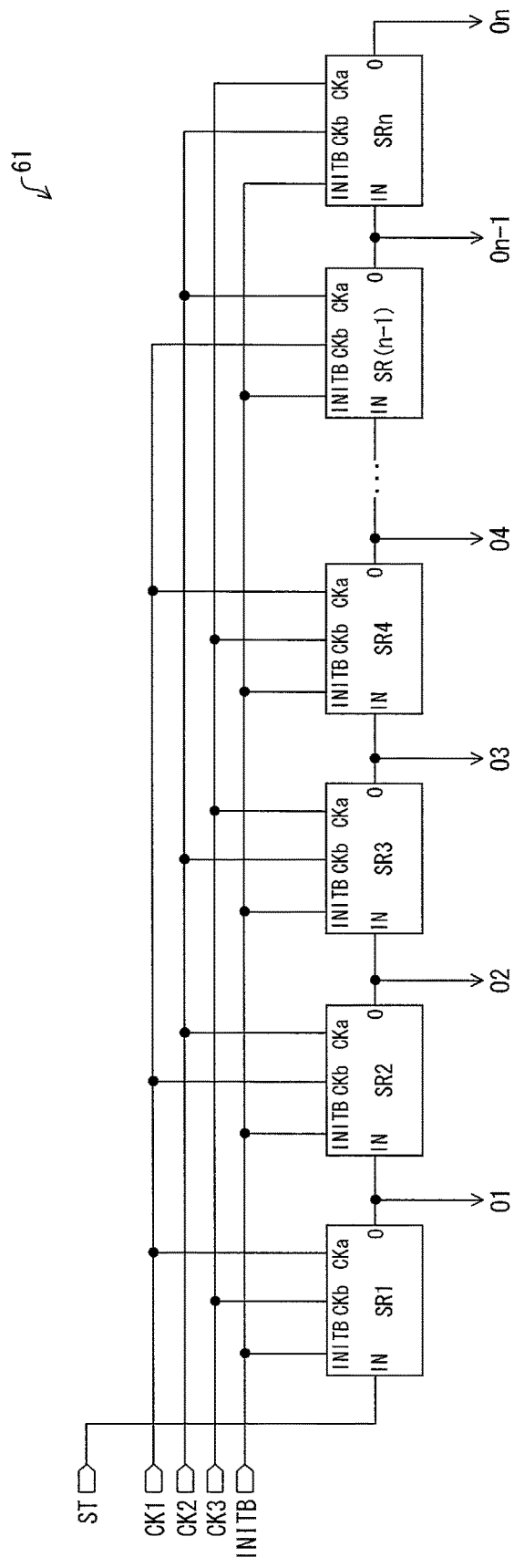
FIG. 29 is a block diagram illustrating a modification of the shift register in accordance with Example 6.

The following description will discuss a modification of a shift register to which a plurality of clock signals are supplied. FIG. 29 is a block diagram illustrating a modification (shift register 61) of the shift register 60 in accordance with Example 6. SR unit circuits, by which the shift register 61 is configured, are identical in configuration to the SR unit circuit illustrated in FIG. 2. According to the shift register 61, there are three phases of clock signals CK (CK1 through CK3). Specifically, the three phases of clock signals CK1 through CK3 are supplied to the shift register 61 via three main clock wires.

According to a first-stage SR unit circuit SR1, a clock signal CK1 and a clock signal CK3 are supplied to a CKa terminal and a CKb terminal, respectively. According to a second-stage SR unit circuit SR2, a clock signal CK2 and the clock signal CK1 are supplied to a CKa terminal and a CKb terminal, respectively. According to a third-stage SR unit circuit SR3, the clock signal CK3 and the clock signal CK2 are supplied to a CKa terminal and a CKb terminal, respectively. According to a fourth-stage SR unit circuit SR4, as is the case of the first-stage SR unit circuit SR1, the clock signal CK1 and the clock signal CK3 are supplied to a CKa terminal and a CKb terminal, respectively. Such connections of the SR unit circuit SR1 through SR3 in relation to one another are thus continually repeated.

Figure 30:
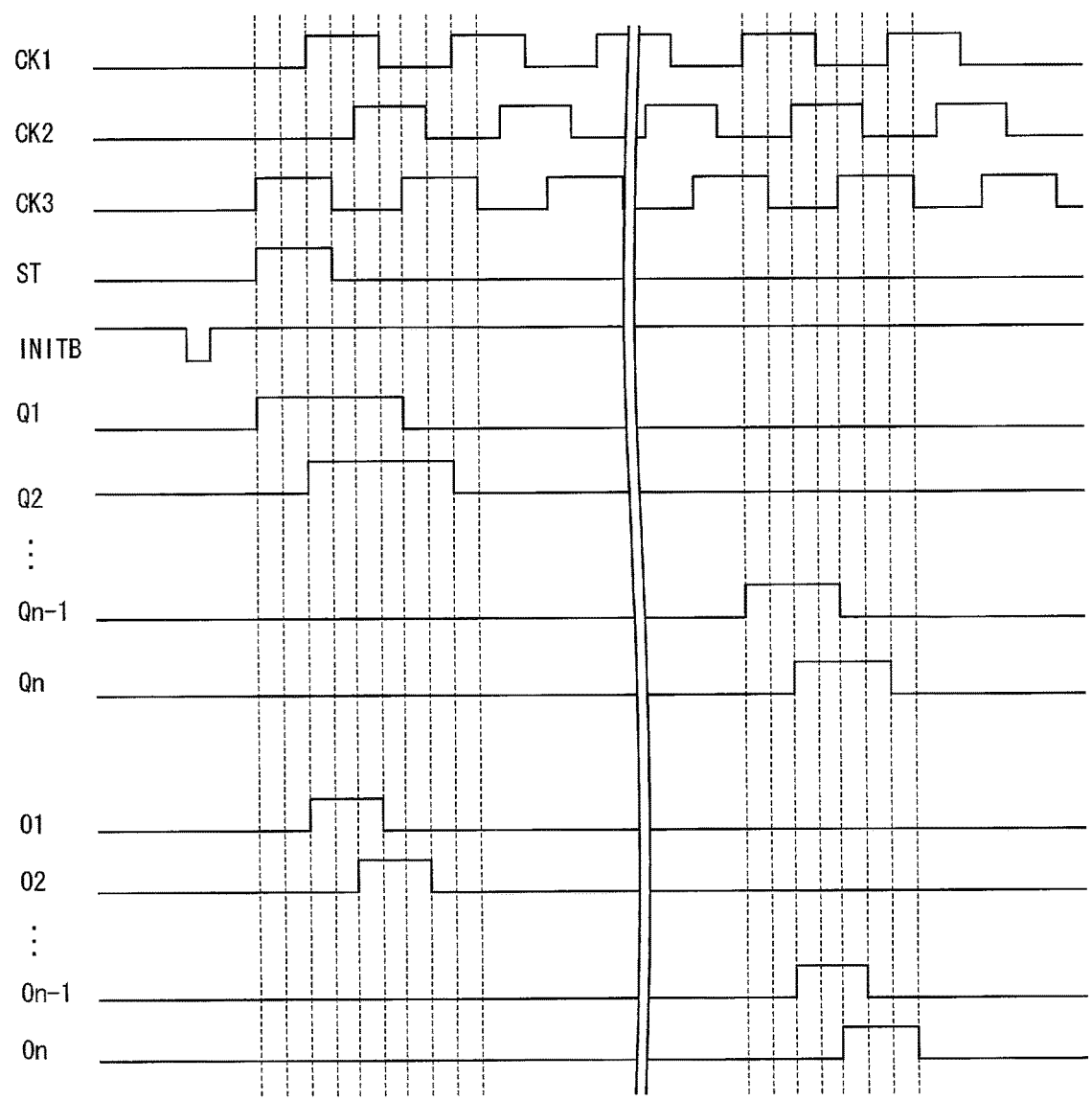
FIG. 30 is a timing chart illustrating the shift register of FIG. 29 in operation.

FIG. 30 is a timing chart of the shift register 61 in operation. As illustrated in FIG. 30, the three phases of clock signals CK1 through CK3 are shifted from one another so that respective rising edges (in a case where a circuit configuration is to be high-active) of the clock signals CK1 through CK3 do not quite match one another. Meanwhile, respective "high" periods of the clock signal CK1 and the clock signal CK2 partially overlap each other, respective "high" periods of the clock signal CK2 and the clock signal CK3 partially overlap each other, and the respective "high" periods of the clock signal CK1 and the clock signal CK3 partially overlap each other. There is no period of time where respective electric potentials of the clock signals CK1 through CK3 become high simultaneously.

Figure 31:
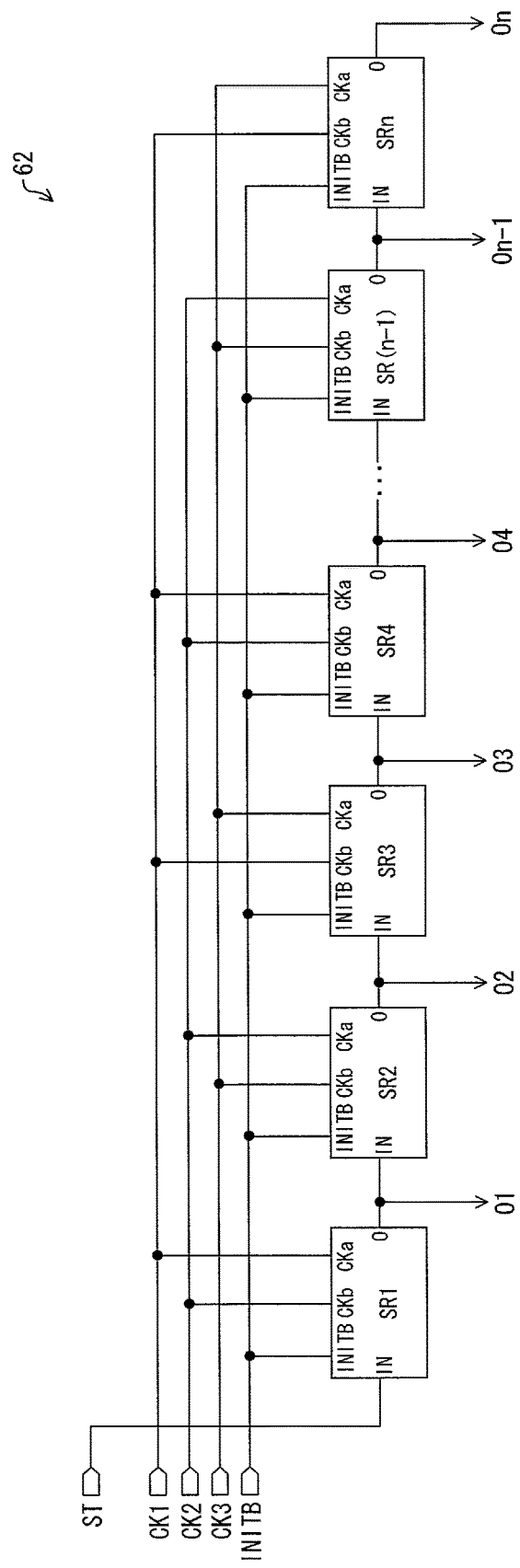
FIG. 31 is a block diagram illustrating another modification of the shift register in accordance with Example 6.

FIG. 31 is a block diagram illustrating a modification (shift register 62) of the shift register 60 in accordance with Example 6. An SR unit circuit, by which the shift register 62 is configured, is identical in configuration to the SR unit circuit illustrated in FIG. 2. According to the shift register 62, as is the case of the shift register 61 illustrated in FIG. 29, there are three phases of clock signals CK (CK1 through CK3).

According to a first-stage SR unit circuit SR1, a clock signal CK1 and a clock signal CK2 are supplied to a CKa terminal and a CKb terminal, respectively. According to a second-stage SR unit circuit SR2, the clock signal CK2 and a clock signal CK3 are supplied to a CKa terminal and a CKb terminal, respectively. According to a third-stage SR unit circuit SR3, the clock signal CK3 and the clock signal CK1 are supplied to a CKa terminal and a CKb terminal, respectively. According to a fourth-stage SR unit circuit SR4, as is the case of the first-stage SR unit circuit SR1, the clock signal CK1 and the clock signal CK2 are supplied to a CKa terminal and a CKb terminal, respectively. Such connections of the SR unit circuit SR1 through SR3 in relation to one another are thus continually repeated.

Figure 32:
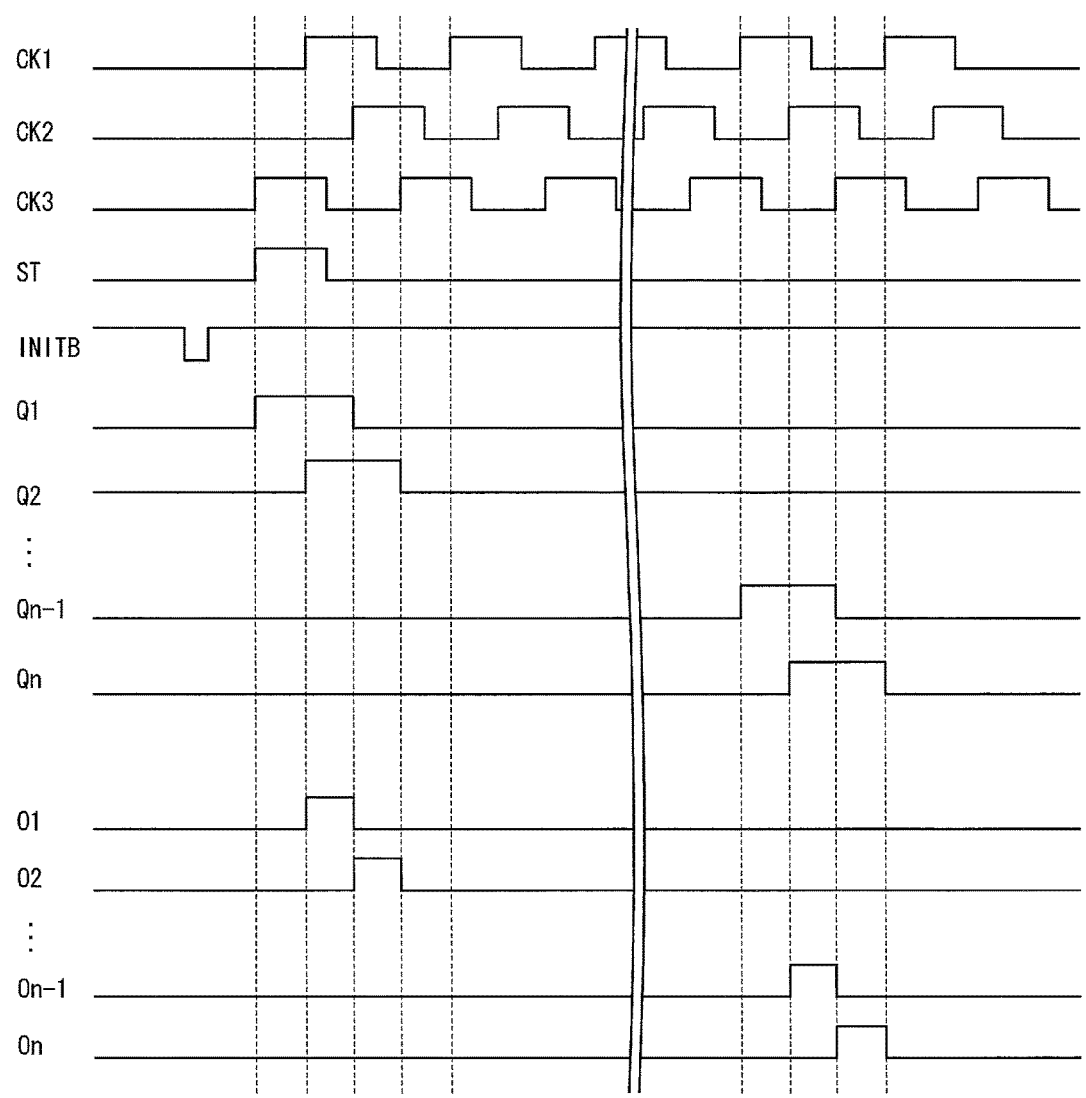
FIG. 32 is a timing chart of the shift register of FIG. 31 in operation.

FIG. 32 is a timing chart of the shift register 62 in operation. As illustrated in FIG. 32, the three phases of clock signals CK1 through CK3 are shifted from one another so that respective rising edges (in a case where a circuit configuration is to be high-active) of the clock signals CK1 through CK3 do not quite match one another. Meanwhile, respective "high" periods of the clock signal CK1 and the clock signal CK2 partially overlap each other, respective "high" periods of the clock signal CK2 and the clock signal CK3 partially overlap each other, and the respective "high" periods of the clock signal CK1 and the clock signal CK3 partially overlap each other. There is no period of time where respective electric potentials of the clock signals CK1 through CK3 become high simultaneously.

(Summary)

In order to attain the object, a shift register of the present invention includes stages each including: a holding circuit; and a clock output circuit, the holding circuit including a first CMOS circuit including a P-channel first transistor and an N-channel second transistor which have respective gate terminals that are connected to each other and which have respective drain terminals that are connected to each other, a second CMOS circuit including a P-channel third transistor and an N-channel fourth transistor which have respective gate terminals that are connected to each other and which have respective drain terminals that are connected to each other, a plurality of input terminals, a first output terminal and a second output terminal, and a reset transistor having (i) a source terminal connected to the plurality of input terminals, (ii) a drain terminal connected to the first CMOS circuit and to the second CMOS circuit, and (iii) a gate terminal that receives a first clock signal, the gate terminals of the first CMOS circuit, the drain terminals of the second CMOS circuit, and the first output terminal being connected to one another, and the drain terminals of the first CMOS circuit, the gate terminals of the second CMOS circuit, and the second output terminal being connected to one another, the clock output circuit including an output terminal that outputs an output signal having a high electric potential or a low electric potential, depending on at least one of output signals from the holding circuit and on a second clock signal, and the holding circuit carrying out a reset operation in accordance with the first clock signal supplied to the reset transistor.

According to the configuration, (i) without increasing the number of transistor elements included in each stage (SR unit circuit described below) of the shift register, it is possible to eliminate lead wiring for an output signal from a following-stage SR unit circuit, which lead wiring is conventionally necessary and (ii) a dummy stage (see FIG. 33) for resetting a last-stage is unnecessary. This allows a reduction in circuit size of a shift register.

The shift register can be configured such that the first clock signal and the second clock signal have respective phases.

The shift register can be configured such that the holding circuit includes a first clock terminal to which the first clock signal is to be supplied; and the clock output circuit includes a second clock terminal to which the second clock signal is to be supplied.

The shift register can be configured such that: a phase of the first clock signal supplied to a reset transistor of a given stage is identical to that of the second clock signal supplied to a clock output circuit of a following stage; and a phase of the second clock signal supplied to a clock output circuit of a given stage is identical to that of the first clock signal supplied to a reset transistor of a following stage.

The shift register can be configured such that one of two clock signals, which are selected from clock signals of m (m is an integer that is 2 or greater) respective phases, is supplied to the first clock terminal whereas the other one of the two clock signals is supplied to the second clock terminal.

With the configuration, it is possible to provide a plurality of main clock wires, and it is therefore possible to reduce the number of transistors to be connected to each main clock wire. This allows a reduction in the load of the main clock wires, and therefore allows a high-speed operation of the shift register.

The shift register can be configured such that: adjacent m (m is an integer that is 2 or greater) stages have respective combinations of the two clock signals; and identical combinations of the two clock signals are repeated at every m stages.

The shift register can be configured such that: each of the stages has a clock terminal to which a clock signal of a single phase is to be supplied; and the clock signal, which has been supplied to the clock terminal, serving as the first clock signal to be supplied to the gate terminal of the reset transistor while serving as the second clock signal to be supplied to the clock output circuit.

With the configuration, it is possible to provide only one main clock wire. This allows a reduction in circuit size of a shift register.

The shift register can be configured such that: each of the stages has (i) a clock terminal to which a clock signal of a single phase is to be supplied and (ii) an inverter connected to the clock terminal; a k-th stage is configured such that the clock signal, which has been supplied to the clock terminal, serves as the first clock signal to be supplied to the gate terminal of the reset transistor, and a signal, which the inverter has generated by inversing the clock signal supplied to the clock terminal, serves as the second clock signal to be supplied to the clock output circuit; and a (k+1)th stage is configured such that the clock signal, which has been supplied to the clock terminal, serves as the second clock signal to be supplied to the clock output circuit, and a signal, which the inverter has generated by inversing the clock signal supplied to the clock terminal, serves as the first clock signal to be supplied to the gate terminal of the reset transistor.

The shift register can be configured such that: each of the stages further includes a selector circuit for switching a scanning direction of the shift register; and an output from the selector circuit is supplied to the source terminal of the reset transistor.

The shift register can be configured such that a resistor is provided between (i) the drain terminal of the reset transistor and (ii) an input terminal of the first CMOS circuit or the second CMOS circuit.

The shift register can be configured such that: each of the stages further includes a buffer to which the output signal from the clock output circuit is supplied; and an output from the buffer serves as an output signal from each of the stages.

The shift register can be configured such that a source terminal of one of the transistors, which are included in the first CMOS circuit and the second CMOS circuit, receives an initializing signal.

The shift register can be configured such that a source terminal of one of the transistors, which are included in the first CMOS circuit and the second CMOS circuit, is connected to (i) the plurality of input terminals of the holding circuit and (ii) the source terminal of the reset transistor.

A scan signal line drive circuit of the present invention includes the shift register, the scan signal line drive circuit being configured such that an output signal from each stage of the shift register serves as a scanning signal to be supplied to a corresponding one of scanning signal lines.

With the configurations, it is possible to achieve a reduction in circuit size of a scan signal line drive circuit.

A display panel of the present invention is configured such that a scan signal line drive circuit as set forth in claim 14 and a pixel circuit are monolithically provided.

With the configuration, it is possible to achieve narrowing of edges of a display panel.

A display device of the present invention includes the scan signal line drive circuit.

With the configuration, it is possible to achieve miniaturization of a display device.

INDUSTRIAL APPLICABILITY

The present invention is suitable for each drive circuit of a display device.

REFERENCE SIGNS LIST

10, 20, 30, 40, 50, 51, 60, 61, 62 Shift register
11 Holding circuit
12 Clock outputting section (clock output circuit)
13 Buffer
SR SR unit circuit (each means of shift register)
RT Reset circuit (reset transistor)
SC Selector circuit
CK Clock terminal

The invention claimed is:
1. A shift register comprising stages each including:
a holding circuit; and
a clock output circuit,
the holding circuit including
  a first CMOS circuit including a P-channel first transistor and an N-channel second transistor which have respective gate terminals that are connected to each other and which have respective drain terminals that are connected to each other,
  a second CMOS circuit including a P-channel third transistor and an N-channel fourth transistor which have respective gate terminals that are connected to each other and which have respective drain terminals that are connected to each other,
  a plurality of input terminals,
  a first output terminal and a second output terminal, and
  a reset transistor having (i) a source terminal connected to the plurality of input terminals, (ii) a drain terminal connected to the first CMOS circuit and to the second CMOS circuit, and (iii) a gate terminal that receives a first clock signal,
the gate terminals of the first CMOS circuit, the drain terminals of the second CMOS circuit, and the first output terminal being connected to one another, and the drain terminals of the first CMOS circuit, the gate terminals of the second CMOS circuit, and the second output terminal being connected to one another,
the clock output circuit including an output terminal that outputs an output signal having a high electric potential or a low electric potential, depending on at least one of output signals from the holding circuit and on a second clock signal,
the holding circuit carrying out a reset operation in accordance with the first clock signal supplied to the reset transistor, and
the first clock signal and the second clock signal have respective phases.
2. The shift register as set forth in claim 1, wherein:
the holding circuit includes a first clock terminal to which the first clock signal is to be supplied; and the clock output circuit includes a second clock terminal to which the second clock signal is to be supplied.

3. The shift register as set forth in claim 2, wherein one of two clock signals, which are selected from clock signals of m (m is an integer that is 2 or greater) respective phases, is supplied to the first clock terminal whereas the other one of the two clock signals is supplied to the second clock terminal.

4. The shift register as set forth in claim 3, wherein:
adjacent m (m is an integer that is 2 or greater) stages have respective combinations of the two clock signals; and
identical combinations of the two clock signals are repeated at every m stages.

5. The shift register as set forth in claim 1, wherein:
each of the stages has a clock terminal to which a clock signal of a single phase is to be supplied; and
the clock signal, which has been supplied to the clock terminal, serving as the first clock signal to be supplied to the gate terminal of the reset transistor while serving as the second clock signal to be supplied to the clock output circuit.

6. The shift register as set forth in claim 1, wherein:
each of the stages has (i) a clock terminal to which a clock signal of a single phase is to be supplied and (ii) an inverter connected to the clock terminal;
a k-th stage is configured such that
the clock signal, which has been supplied to the clock terminal, serves as the first clock signal to be supplied to the gate terminal of the reset transistor, and
a signal, which the inverter has generated by inversing the clock signal supplied to the clock terminal, serves as the second clock signal to be supplied to the clock output circuit; and
a (k+1)th stage is configured such that
the clock signal, which has been supplied to the clock terminal, serves as the second clock signal to be supplied to the clock output circuit, and
a signal, which the inverter has generated by inversing the clock signal supplied to the clock terminal, serves as the first clock signal to be supplied to the gate terminal of the reset transistor.

7. The shift register as set forth in claim 1, wherein a resistor is provided between (i) the drain terminal of the reset transistor and (ii) an input terminal of the first CMOS circuit or the second CMOS circuit.

8. A shift register as set forth in claim 1, wherein:
each of the stages further includes a buffer to which the output signal from the clock output circuit is supplied; and
an output from the buffer serves as an output signal from each of the stages.

9. The shift register as set forth in claim 1, wherein a source terminal of one of the transistors, which are included in the first CMOS circuit and the second CMOS circuit, receives an initializing signal.

10. The shift register as set forth in claim 1, wherein a source terminal of one of the transistors, which are included in the first CMOS circuit and the second CMOS circuit, is connected to (i) the plurality of input terminals of the holding circuit and (ii) the source terminal of the reset transistor.

11. A scan signal line drive circuit comprising a shift register as set forth in claim 1,
the scan signal line drive circuit being configured such that an output signal from each stage of the shift register serves as a scanning signal to be supplied to a corresponding one of scanning signal lines.

12. A display panel in which a scan signal line drive circuit as set forth in claim 11 and a pixel circuit are monolithically provided.

13. A display device comprising a scan signal line drive circuit as set forth in claim 11.

14. A shift register comprising stages each including:
a holding circuit; and
a clock output circuit,
the holding circuit including
a first CMOS circuit including a P-channel first transistor and an N-channel second transistor which have respective gate terminals that are connected to each other and which have respective drain terminals that are connected to each other,
a second CMOS circuit including a P-channel third transistor and an N-channel fourth transistor which have respective Rate terminals that are connected to each other and which have respective drain terminals that are connected to each other,
a plurality of input terminals,
a first output terminal and a second output terminal, and
a reset transistor having (i) a source terminal connected to the plurality of input terminals, (ii) a drain terminal connected to the first CMOS circuit and to the second CMOS circuit, and (iii) a gate terminal that receives a first clock signal,
the gate terminals of the first CMOS circuit, the drain terminals of the second CMOS circuit, and the first output terminal being connected to one another, and the drain terminals of the first CMOS circuit, the gate terminals of the second CMOS circuit, and the second output terminal being connected to one another,
the clock output circuit including an output terminal that outputs an output signal having a high electric potential or a low electric potential, depending on at least one of output signals from the holding circuit and on a second clock signal,
the holding circuit carrying out a reset operation in accordance with the first clock signal supplied to the reset transistor,
a phase of the first clock signal supplied to a reset transistor of a given stage is identical to that of the second clock signal supplied to a clock output circuit of a following stage; and
a phase of the second clock signal supplied to a clock output circuit of a given stage is identical to that of the first clock signal supplied to a reset transistor of a following stage.

15. A shift register comprising stages each including:
a holding circuit; and
a clock output circuit,
the holding circuit including
a first CMOS circuit including a P-channel first transistor and an N-channel second transistor which have respective gate terminals that are connected to each other and which have respective drain terminals that are connected to each other,
a second CMOS circuit including a P-channel third transistor and an N-channel fourth transistor which have respective Rate terminals that are connected to each other and which have respective drain terminals that are connected to each other,
a plurality of input terminals,
a first output terminal and a second output terminal, and a reset transistor having (i) a source terminal connected to the plurality of input terminals, (ii) a drain terminal connected to the first CMOS circuit and to the second CMOS circuit, and (iii) a gate terminal that receives a first clock signal, the gate terminals of the first CMOS circuit, the drain terminals of the second CMOS circuit, and the first output terminal being connected to one another, and the drain terminals of the first CMOS circuit, the gate terminals of the second CMOS circuit, and the second output terminal being connected to one another, the clock output circuit including an output terminal that outputs an output signal having a high electric potential or a low electric potential, depending on at least one of output signals from the holding circuit and on a second clock signal, the holding circuit carrying out a reset operation in accordance with the first clock signal supplied to the reset transistor, each of the stages further includes a selector circuit for switching a scanning direction of the shift register; and an output from the selector circuit is supplied to the source terminal of the reset transistor.

* * * * *